United States Patent
Han et al.

(10) Patent No.: US 10,192,022 B2
(45) Date of Patent: Jan. 29, 2019

(54) GEOMETRIC MODELING SYSTEM WITH INTELLIGENT BEHAVIORS OF DESIGN COMPONENTS

(71) Applicant: IronCAD, LLC, Atlanta, GA (US)

(72) Inventors: Tao-Yang Han, Atlanta, GA (US); Yawei Li, Atlanta, GA (US)

(73) Assignee: IRONCAD, LLC, Atlanta, GA (US)

( * ) Notice: Subject to any disclaimer, the term of this patent is extended or adjusted under 35 U.S.C. 154(b) by 404 days.

(21) Appl. No.: 14/729,568

(22) Filed: Jun. 3, 2015

(65) Prior Publication Data
US 2015/0356209 A1 Dec. 10, 2015

Related U.S. Application Data

(60) Provisional application No. 62/007,737, filed on Jun. 4, 2014.

(51) Int. Cl.
*G06F 17/50* (2006.01)
*G06T 19/20* (2011.01)

(52) U.S. Cl.
CPC ...... *G06F 17/5086* (2013.01); *G06F 17/5095* (2013.01); *G06T 19/20* (2013.01); *G06T 2200/24* (2013.01); *G06T 2219/2008* (2013.01); *G06T 2219/2012* (2013.01)

(58) Field of Classification Search
CPC .. G06F 17/50; G06F 2217/00; G06F 2217/02; G06F 2217/04; G06T 17/00; G06T 19/00; G05B 19/4097
USPC ........................................................ 345/420
See application file for complete search history.

(56) References Cited

U.S. PATENT DOCUMENTS

| 6,041,171 | A | * | 3/2000 | Blaisdell | ................ | G06F 17/50 |
| | | | | | | 703/6 |
| 6,219,049 | B1 | * | 4/2001 | Zuffante | ................ | G06F 17/50 |
| | | | | | | 345/420 |
| 8,910,273 | B1 | * | 12/2014 | Fausak | ................... | H04L 67/42 |
| | | | | | | 709/220 |
| 2003/0067487 | A1 | * | 4/2003 | Kohls | ..................... | G06F 17/50 |
| | | | | | | 715/764 |

(Continued)

OTHER PUBLICATIONS

Yin, ZhouPing, et al. "A connector-based hierarchical approach to assembly sequence planning for mechanical assemblies." Computer-Aided Design 35.1 (2003): 37-56.*

*Primary Examiner* — Sae Won Yoon
(74) *Attorney, Agent, or Firm* — Locke Lord LLP; Tim Tingkang Xia, Esq.

(57) ABSTRACT

A computer-aided design (CAD) geometric modeling system, including a CAD software, a data store, a connector building module, a pairing module and an intelligent behavior module, all executable by at least one computing device. A user may use the CAD software to implement geometric models for multiple components. The data store stores necessary information of the system. The connector building module may add connectors on the components. The pairing module may identify a first component and at least one second component capable of matching the first component, and then identify connectors on the first and second components to match the first component to the second component by forming a matching pair of the identified connectors based on the pairing rules. The intelligent behavior module may receive the intelligent rules for the intelligent behaviors of the components of the matching pair, and invoke intelligent behaviors according to the intelligent rules.

42 Claims, 10 Drawing Sheets

(56) References Cited

U.S. PATENT DOCUMENTS

| | | | | |
|---|---|---|---|---|
| 2004/0098151 | A1* | 5/2004 | Carlucci | G06F 17/50 700/95 |
| 2006/0241800 | A1* | 10/2006 | Fujinuma | G06F 17/50 700/98 |
| 2007/0168923 | A1* | 7/2007 | Connor | G06F 17/50 717/104 |
| 2008/0162090 | A1* | 7/2008 | Perry | G06F 17/5018 703/1 |
| 2008/0222568 | A1* | 9/2008 | Okuwaki | G06F 17/50 715/825 |
| 2009/0040223 | A1* | 2/2009 | Hudetz | G06T 17/10 345/427 |
| 2011/0087977 | A1* | 4/2011 | Campney | G05B 19/0426 715/763 |
| 2012/0259845 | A1* | 10/2012 | Matejka | G06F 17/30528 707/723 |
| 2013/0135228 | A1* | 5/2013 | Won | G06F 3/04883 345/173 |
| 2013/0186957 | A1* | 7/2013 | Endo | G06K 7/12 235/469 |
| 2014/0039847 | A1* | 2/2014 | Georgescu | G06F 9/4881 703/1 |
| 2014/0071138 | A1* | 3/2014 | Gibson | G06T 11/206 345/501 |
| 2014/0085331 | A1* | 3/2014 | Davis | G09G 5/377 345/629 |
| 2014/0282177 | A1* | 9/2014 | Wang | G06F 3/0481 715/771 |
| 2015/0002371 | A1* | 1/2015 | Burgess | G09G 5/12 345/1.2 |
| 2015/0029181 | A1* | 1/2015 | Lerey | G06T 19/003 345/419 |
| 2015/0113370 | A1* | 4/2015 | Flider | G06F 17/211 715/204 |

* cited by examiner

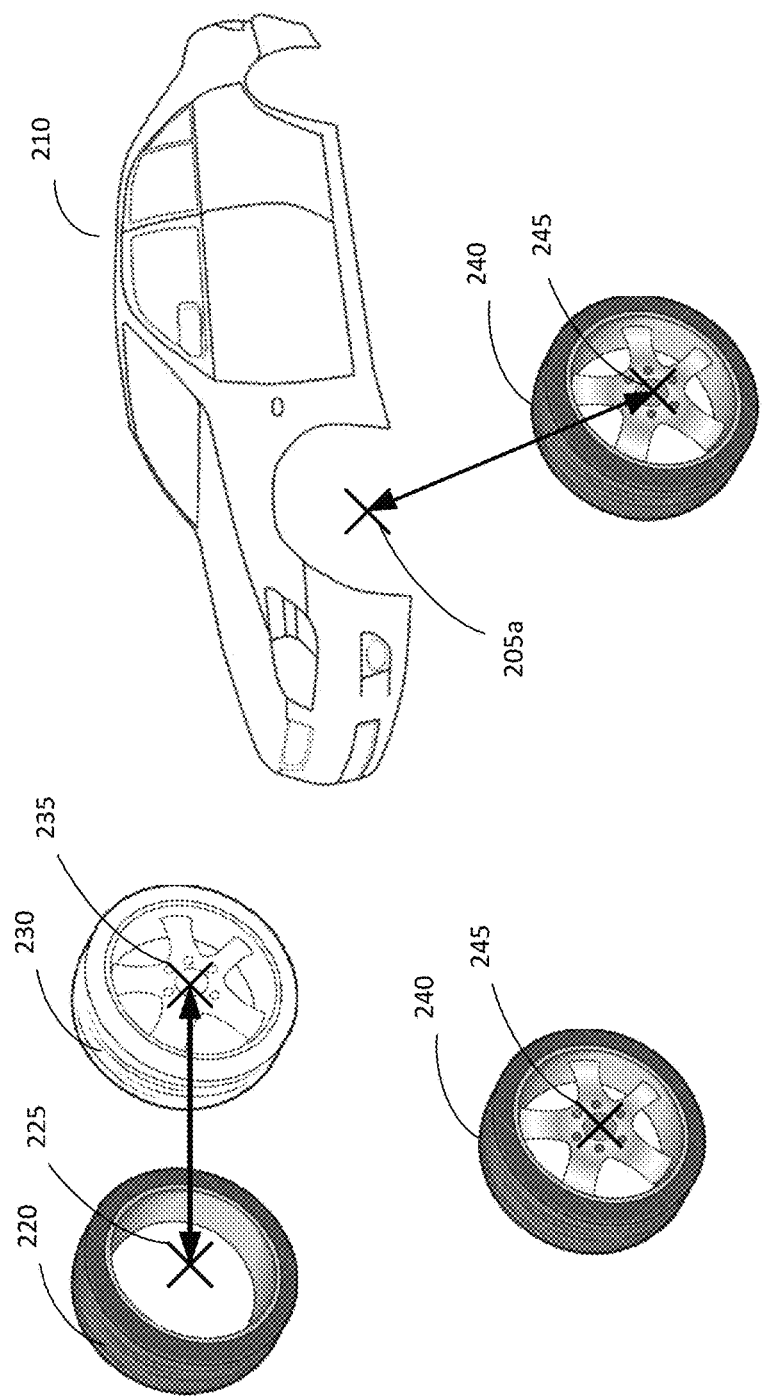

GEOMETRIC MODELING SYSTEM WITH INTELLIGENT BEHAVIORS OF DESIGN COMPONENTS

CROSS-REFERENCE TO RELATED PATENT APPLICATION

This application claims priority to and the benefit of, pursuant to 35 U.S.C. § 119(e), U.S. provisional patent application Ser. No. 62/007,737, filed Jun. 4, 2014, entitled "GEOMETRIC MODELING SYSTEM WITH INTELLIGENT BEHAVIOR OF DESIGN COMPONENTS", by Tao Yang Han and Yawei Li, the disclosure of which is incorporated herein in its entirety by reference.

FIELD OF THE INVENTION

This invention relates generally to computer-aided design (CAD) methods and software applications, and particularly to computerized geometric modeling systems with intelligent behaviors of design components.

BACKGROUND OF THE INVENTION

The computer has greatly affected essentially all forms of information management, including the geometric modeling arts. Nowadays there are numerous computer program products that allow the user to create, store, and modify geometric models and their graphical renderings of various types on a display screen, and to print or otherwise output such geometric models and their renderings. Such geometric models and their graphical renderings span the gambit from simple to complex, and can vary in subject matter, e.g., artistic, industrial, etc. Some geometric modeling computer program products are two dimensional, providing only dimensions of solid shapes or parts on certain planes. The more complex three dimensional (3D) computer program products, on the other hand, provide dimensions in real three dimensional space. However, there is a lack of new methodologies and technology for 3D computerized geometric modeling systems with additional intelligence to assist users to perform geometric design and other behaviors or design features.

Therefore, a heretofore unaddressed need exists in the art to address the aforementioned deficiencies and inadequacies.

SUMMARY OF THE INVENTION

In one aspect, the present invention relates to a computer-aided design (CAD) geometric modeling system. In certain embodiments, the system includes: a CAD software executable by at least one computing device, configured to implement a geometric model for each of a plurality of components; a data store configured to store component information of the components, connector information of a plurality of connectors on the components, pairing rule information corresponding to a plurality of pairing rules, and intelligent rule information corresponding to a plurality of intelligent rules; a connector building module executable by the at least one computing device, configured to add the connectors on the components; a pairing module executable by the at least one computing device, configured to: identify a first component; identify at least one second component capable of matching the first component; identify one or more first connectors on the first component and one or more second connectors on the second component; and match the first component to the second component by forming a matching pair of one of the identified first connectors and one of the identified second connectors based on the pairing rules; an intelligent behavior module executable by the at least one computing device, configured to: receive the intelligent rules for the intelligent behaviors of the components of the matching pair; and invoke intelligent behaviors applied to or associated with the components of the matching pair according to the intelligent rules.

In certain embodiments, the geometric model of each of the components is a solid shape model, a polygonal shape model, a point cloud set model, or a combination thereof.

In certain embodiments, the system further includes: a hierarchy module executable by the at least one computing device, configured to determine a plurality of levels of the components having the connectors thereon based on hierarchical structures of the components; determine one of the identified second components to be the second component matching with the first component based on a plurality of hierarchy rules and the level of the components; and determine scope and priority of the connectors based on the hierarchy rules and the hierarchical structures, where the data store further stores hierarchy rule information corresponding to the hierarchy rules.

In certain embodiments, the pairing module is configured to identify the one or more first connectors on the first component and the one or more second connectors on the second component by: identifying the one or more first connectors on the first component; identifying a plurality of first auxiliary connectors on one or more below components of the first component according to the scope determined by the hierarchy module and the hierarchical structures; identifying the one or more second connectors on the second component; and identifying a plurality of second auxiliary connectors on one or more above component and one or more below components of the second component according to the scope determined by the hierarchy module and the hierarchical structures.

In certain embodiments, the pairing module is further configured to form the matching pair by: selecting one of the identified first connectors and the identified first auxiliary connectors, and selecting one of the identified second connectors and the identified second auxiliary connectors, based on the priority determined by the hierarchy module and the pairing rules.

In certain embodiments, the pairing module is configured to identify the first component and the second component according to user interface (UI) commands.

In certain embodiments, the pairing module is further configured to: when a plurality of the first connectors is identified on the first component as possible connector candidates to form the matching pair, control the CAD software to highlight one or more of the identified first connectors on the first component.

In certain embodiments, the pairing module is further configured to: list all of the formable matching pairs between the first connectors on the first component and the second connectors on the second component to allow a user to preview the matching result of each of the formable matching pairs and to select one of the formable matching pairs as the preferred matching pair.

In certain embodiments, the data store is a local database stored in the at least one computing device.

In certain embodiments, the data store is a virtual database which resides in a remote computing device, wherein the remote computing device is remotely connected to the at least one computing device through a network.

In certain embodiments, the network is an Internet, a Local Area Network (LAN), or a Wide Area Network (WAN).

In certain embodiments, the pairing module is further configured to access the pairing rules from the virtual database through the network.

In certain embodiments, the received intelligent rules for the intelligent behaviors of the components of the matching pair comprises: geometric data, procurement data, engineering and manufacturing rules, business rules, design for manufacturing and assembly rules, manufacturing process information, materials rules and other customized rules and information.

In certain embodiments, the intelligent behavior module further comprises: a geometric adjustment module executable by the at least one computing device, configured to perform an operation to the components of the matching pair, wherein the operation comprises: positioning the first component in association to a location of the one of the identified second connectors; modifying the geometric data of the first and second components related to the matching pair based on the intelligent rules.

In certain embodiments, the intelligent behavior module further comprises: a constraint adding module executable by the at least one computing device, configured to perform an operation to the components of the matching pair, wherein the operation comprises: establishing one or more constraint relationships between the first and second components related to the matching pair based on the intelligent rules.

In certain embodiments, the CAD geometric modeling system further includes a computer-aided engineering (CAE) software to perform a CAE process. In certain embodiments, the CAE process comprises finite element analysis, stress analysis, thermal analysis, electromagnetics analysis, fluid dynamic analysis, kinematics analysis, collision analysis, and dynamic analysis.

The intelligent behaviors of the connectors comprises: invoking the CAE software to perform the CAE process; communicating with outside resources; adjusting the matched pairing components; adjusting designing of the components; invoking cloud computing and invoking expert analysis.

Another aspect of the present invention relates to a computer-implemented method of performing geometric modeling on a computer-aided design (CAD) software. In one embodiment, the method includes: (a) adding, by a connector building module executable by at least one computing device, a plurality of connectors on a plurality of components, wherein the CAD software is configured to implement a geometric model for each of the plurality of components, and a data store is configured to store component information of the components, connector information of the connectors on the components, pairing rule information corresponding to a plurality of pairing rules, and intelligent rule information corresponding to a plurality of intelligent rules; (b) identifying, by a pairing module executable by the at least one computing device, a first component; (c) identifying, by the pairing module, at least one second component capable of matching the first component; (d) identifying, by the pairing module, one or more first connectors on the first component and one or more second connectors on the second component; (e) matching, by the pairing module, the first component to the second component by forming a matching pair of one of the identified first connectors and one of the identified second connectors based on the pairing rules; (f) receiving, by an intelligent behavior module executable by the at least one computing device, the intelligent rules for the intelligent behaviors of the components of the matching pair; and (g) invoking, by the intelligent behavior module, intelligent behaviors applied to or associated with the components of the matching pair according to the intelligent rules.

In certain embodiments, the method further includes: determining, by a hierarchy module of the CAD geometric modeling system executable by the at least one computing device, a plurality of levels of the components having the connectors thereon based on hierarchical structures of the components; determining, by the hierarchy module, one of the identified second components to be the second component matching with the first component based on a plurality of hierarchy rules and the level of the components; and determining, by the hierarchy module, scope and priority of the connectors based on the hierarchy rules and the hierarchical structures, where the data store further stores hierarchy rule information corresponding to the hierarchy rules.

In certain embodiments, the step (d) includes: identifying, by the pairing module, the one or more first connectors on the first component; identifying, by the pairing module, a plurality of first auxiliary connectors on one or more below components of the first component according to the scope determined by the hierarchy module and the hierarchical structures; identifying, by the pairing module, the one or more second connectors on the second component; and identifying, by the pairing module, a plurality of second auxiliary connectors on one or more above component and one or more below components of the second component according to the scope determined by the hierarchy module and the hierarchical structures.

In certain embodiments, the pairing module is configured to form the matching pair by: selecting one of the identified first connectors and the identified first auxiliary connectors, and selecting one of the identified second connectors and the identified second auxiliary connectors, based on the priority determined by the hierarchy module and the pairing rules.

In certain embodiments, the pairing module is configured to identify the first component and the second component according to user interface (UI) commands.

In certain embodiments, the method further includes: when a plurality of the first connectors is identified on the first component as possible connector candidates to form the matching pair, controlling, by the pairing module, the CAD software to highlight one or more of the identified first connectors on the first component.

In certain embodiments, the method further includes: listing, by the pairing module, all of the formable matching pairs between the first connectors on the first component and the second connectors on the second component to allow a user to preview the matching result of each of the formable matching pairs and to select one of the formable matching pairs as the preferred matching pair.

In certain embodiments, the received intelligent rules for the intelligent behaviors of the components of the matching pair comprises: geometric data, procurement data, engineering and manufacturing rules, business rules, design for manufacturing and assembly rules, manufacturing process information, materials rules and other customized rules and information.

In certain embodiments, the method further includes: performing, by a geometric adjustment module executable by the at least one computing device, an operation to the components of the matching pair, wherein the operation includes: positioning, by the geometric adjustment module, the first component in association to a location of the one of the identified second connectors; modifying, by the geometric adjustment module, the geometric data of the first and second components related to the matching pair based on the intelligent rules.

In certain embodiments, the method further includes: performing, by a constraint adding module executable by the at least one computing device, an operation to the components of the matching pair, wherein the operation includes: establishing, by the constraint adding module, one or more constraint relationships between the first and second components related to the matching pair based on the intelligent rules.

Another aspect of the present invention relates to a non-transitory computer readable medium storing computer executable code. In one embodiment, the computer executable code, when executed at a processor, is configured to: add a plurality of connectors on a plurality of components, wherein the CAD software is configured to implement a geometric model for each of the plurality of components, and a data store is configured to store component information of the components, connector information of the connectors on the components, pairing rule information corresponding to a plurality of pairing rules, and intelligent rule information corresponding to a plurality of intelligent rules; identify a first component; identify at least one second component capable of matching the first component; identify one or more first connectors on the first component and one or more second connectors on the second component; match the first component to the second component by forming a matching pair of one of the identified first connectors and one of the identified second connectors based on the pairing rules; receive the intelligent rules for the intelligent behaviors of the components of the matching pair; and invoke intelligent behaviors applied to or associated with the components of the matching pair according to the intelligent rules.

In certain embodiments, the computer executable code includes: a connector building module configured to add the connectors on the components; a pairing module configured to: identify the first component; identify the at least one second component capable of matching the first component; identify the one or more first connectors on the first component and the one or more second connectors on the second component; and match the first component to the second component by forming the matching pair based on the pairing rules; and an intelligent behavior module configured to receive the intelligent rules for the intelligent behaviors of the components of the matching pair; and invoke intelligent behaviors applied to or associated with the components of the matching pair according to the intelligent rules.

In certain embodiments, the computer executable code further includes a hierarchy module, configured to: determine a plurality of levels of the components having the connectors thereon based on hierarchical structures of the components; determine one of the identified second components to be the second component matching with the first component based on a plurality of hierarchy rules and the level of the components; and determine scope and priority of the connectors at components of the corresponding hierarchical levels of the hierarchical structures, wherein the data store further stores hierarchy rule information corresponding to the hierarchy rules.

In certain embodiments, the pairing module is configured to identify the one or more first connectors on the first component and the one or more second connectors on the second component by: identifying the one or more first connectors on the first component; identifying a plurality of first auxiliary connectors on one or more below components of the first component according to the scope determined by the hierarchy module and the hierarchical structures; identifying the one or more second connectors on the second component; and identifying a plurality of second auxiliary connectors on one or more above component and one or more below components of the second component according to the scope determined by the hierarchy module and the hierarchical structures.

In certain embodiments, the pairing module is configured to form the matching pair by selecting one of the identified first connectors and the identified first auxiliary connectors, and selecting one of the identified second connectors and the identified second auxiliary connectors, based on the priority determined by the hierarchy module and the pairing rules.

In certain embodiments, the pairing module is configured to identify the first component and the second component according to user interface (UI) commands.

In certain embodiments, the pairing module is further configured to: when a plurality of the first connectors is identified on the first component as possible connector candidates to form the matching pair, control the CAD software to highlight one or more of the identified first connectors on the first component.

In certain embodiments, the pairing module is further configured to: list all of the formable matching pairs between the first connectors on the first component and the second connectors on the second component to allow a user to preview the matching result of each of the formable matching pairs and to select one of the formable matching pairs as the preferred matching pair.

In certain embodiments, the received intelligent rules for the intelligent behaviors of the components of the matching pair comprises: geometric data, procurement data, engineering and manufacturing rules, business rules, design for manufacturing and assembly rules, manufacturing process information, materials rules and other customized rules and information.

In certain embodiments, the intelligent behavior module comprises a geometric adjustment module configured to perform an operation to the components of the matching pair, wherein the operation includes: positioning the first component in association to a location of the one of the identified second connectors; modifying the geometric data of the first and second components related to the matching pair based on the intelligent rules.

In certain embodiments, the intelligent behavior module comprises a constraint adding module configured to perform an operation to the components of the matching pair, wherein the operation includes: establish one or more constraint relationships between the first and second components related to the matching pair based on the intelligent rules.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment. The following figures are presented for the purpose of illustration only, and are not intended to be limiting.

FIG. 2B schematically shows a tire assembly according to certain embodiments of the present invention.

FIG. 2C schematically shows a matching pair formed between a tire assembly and a car body according to certain embodiments of the present invention.

DETAILED DESCRIPTION OF THE INVENTION

Figure 1:
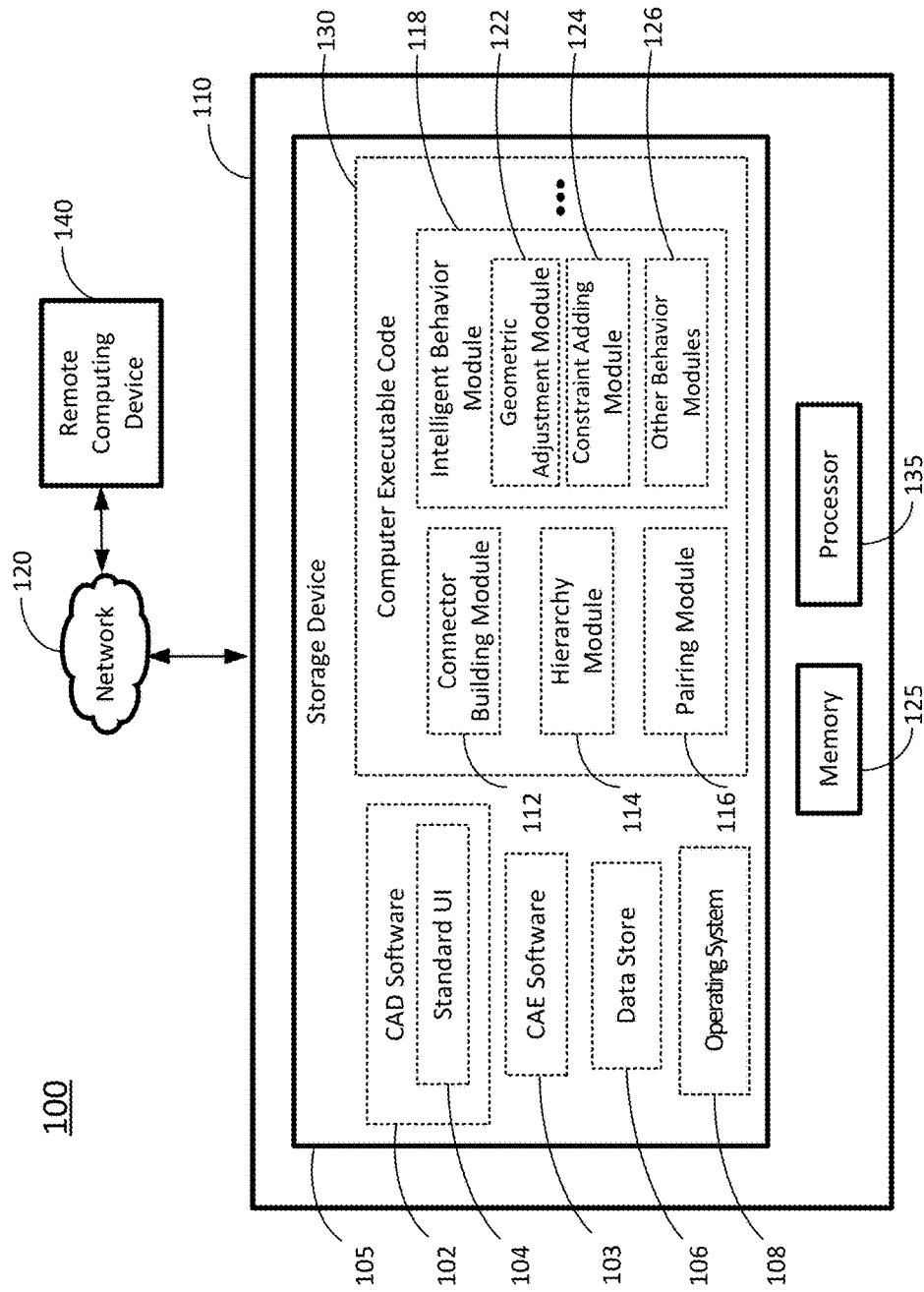
FIG. 1 schematically shows a computer-aided design (CAD) geometric modeling system according to certain embodiments of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Referring to the drawings, like numbers indicate like components throughout the views. As used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which has no influence on the scope of the invention.

As used herein, the phrase "at least one of A, B, and C" should be construed to mean a logical (A or B or C), using a non-exclusive logical OR. It should be understood that one or more steps within a method may be executed in different order (or concurrently) without altering the principles of the present disclosure.

As used herein, the term "computer-aided design software" or its abbreviation "CAD software" may refer to computer-aided design software and any other design collaboration software, such as space planning, architecture, computer-aided engineering (CAE), or game features that include geometric modeling of components or similar actions.

As used herein, the term "solid shape" may refer to a 3D geometric object represented by Boundary Representation (BREP). A solid shape object can be a solid (closed volume), surface/sheet, and or wire shape.

As used herein, the term "hierarchical structure" is a hierarchical structure of components created by a CAD software representing a 3D model, which may include multiple levels. A higher level component (above component or assembly) may be composed of a number of lower level components (below components). Any one of the below components may be a component by itself and has no other components below it (simple component or part), or an above component which has its own below components (sub-assembly). For example, a 3D model representing a table is an assembly which is composed of table top, support, and container. Support and container are subassemblies and each is composed of a number of leg parts and drawer parts, respectively; while table top is a part.

As used herein, the term "module" may refer to, be part of, or include suitable software components that provide the described functionality. In certain embodiments, the term module may include both software components, such as codes, and hardware components that execute the codes.

The term "code", as used herein, may include software, firmware, and/or microcode, and may refer to programs, routines, functions, classes, and/or objects. The term "shared", as used herein, means that some or all code from multiple hardware modules may be executed using a single (shared) processor. In addition, some or all code from multiple hardware modules may be stored by a single (shared) memory. The term "group", as used herein, means that some or all code from a single hardware module may be executed using a group of processors. In addition, some or all code from a single hardware module may be stored using a group of memories.

The terms used in this specification generally have their ordinary meanings in the art, within the context of the invention, and in the specific context where each term is used.

Certain terms that are used to describe the invention are discussed below, or elsewhere in the specification, to provide additional guidance to the practitioner in describing the apparatus and methods of the invention and how to make and use them. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and in no way limits the scope and meaning of the invention or of any exemplified term. Likewise, the invention is not limited to various embodiments given in this specification. Furthermore, subtitles may be used to help a reader of the specification to read through the specification, which the usage of subtitles, however, has no influence on the scope of the invention.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising," "including," "having," "containing," "involving," and the like are to be understood to be open-ended, i.e., to mean including but not limited to.

Overview of the Invention

Product design in a geometric modeling system usually involves putting multiple design components together. For instance, assembling parts and sub-assemblies together into a parent assembly is one of such operations. These design components may be three-dimensional or two-dimensional geometric objects, and such objects may be represented in various ways. For example, a 3D geometric object may be represented as a solid shape, a polygonal shape, or a set of point cloud, etc. In addition, each of these design components may be a simple object or a complex object that itself has hierarchical structure. For instance, in an assembly, each part of the assembly is an example of a simple object, and the assembly as a whole is a complex object with hierarchical structures of parts and sub-assemblies.

When two components are put together, possibly by moving one component onto the other component, there may be certain relationships between them to be established, and sometimes maintained. These relationships may be geometric relations, engineering relations, manufacturing relations, or any customized relations. When a user puts a bolt and nut together, their relative position, orientation, and size must be having certain geometric relations so that they can fit together. As an option to the designer, such relations may be maintained as engineering design intents, or constraints, between the two components. Another example is to put a cantilever beam onto a column, not only they have certain geometric relations but also they have engineering relations to represent a welded boundary condition at the contact area between the beam and the column. Such engineering relations will influence the physical behavior between the two components, and are key information in performing computer-aided engineering (CAE) simulation such as Finite Element Analysis (FEA), stress analysis, thermal analysis, electromagnetics analysis, fluid dynamic analysis, kinematics analysis, collision analysis, dynamic analysis, or any other suitable CAE process or analysis.

Similarly, when modifying a component's geometry, position, etc., by referring to another component's geometry there also may have certain relationships between these two components to be established. One example is to stretch the length of a beam until it reaches a particular location on the bearing plat sitting on top of a column. Whether to put two components together or modify one component and refer to another component's geometry, the operation usually is accomplished by invoking certain User Interface (UI) action. Such UI action could be drag & drop a component onto another component, pulling a handle on one component and release it onto another component, or other modification and position tools and UI actions.

In order to establish such relationships between two components when a related UI action is invoked by users, certain following actions need to be performed by the system. These actions typically are performed by the users invoking certain other UI commands. For instance, after dragging and dropping a bolt to a nut, the system may perform operations such as using a position UI command to align the bolt to the nut, and using a change size UI command to make the bold size fit the nut size. Another example is to invoke coaxial and mate constraints UI commands to maintain the positional relationship of these two components.

In many cases the relationships between two components and desired following actions are known and can be predetermined or can be governed by certain rules. If information about such relationships and following actions are available when an UI action involving such two components is executed, then intelligent behaviors may happen automatically and automate the desired actions to establish such relationships.

In view of previous invention using connectors to achieve such intelligent configuration of solid shapes focus on positional and geometric information and procurement consideration, certain embodiments of the present invention extends the connector technology with additional intelligence to cover engineering application, manufacturing, and general customized behaviors.

In one aspect, the present invention relates to a computer-aided design (CAD) geometric modeling system. In one embodiment, the system includes: a CAD software executable by at least one computing device, configured to implement a geometric model for each of a plurality of components; a data store configured to store component information of the components, connector information of a plurality of connectors on the components, pairing rule information, and intelligent rule information; a connector building module executable by the at least one computing device, configured to add the connectors on the components; a pairing module executable by the at least one computing device, configured to identify a first component (movant component), identify at least one second component (target component) capable of matching the first component, identify one or more first connectors on the first component and one or more second connectors on the second component and match the first component to the second component by forming a matching pair of one of the identified first connectors and one of the identified second connectors based on the pairing rules; an adjustment module executable by the at least one computing device, configured to receive the intelligent rules for the intelligent behaviors of the components of the matching pair and invoke intelligent behaviors applied to or associated with the components of the matching pair according to the intelligent rules.

Another aspect of the present invention relates to a computer-implemented method of performing geometric modeling on a computer-aided design (CAD) software. In one embodiment, the method includes: adding, by a connector building module executable by at least one computing device, a plurality of connectors on a plurality of components, wherein the CAD software is configured to implement a geometric model for each of the plurality of components, and a data store is configured to store component information of the components, connector information of the connectors on the components, pairing rule information, and intelligent rule information; identifying, by a pairing module executable by the at least one computing device, a first component; identifying, by the pairing module, at least one second component capable of matching the first component; identifying, by the pairing module, one or more first connectors on the first component and one or more second connectors on the second component; matching, by the pairing module, the first component to the second component by forming a matching pair of one of the identified first connectors and one of the identified second connectors based on the pairing rules; receiving, by an adjustment module executable by the at least one computing device, the intelligent rules for the intelligent behaviors of the components of the matching pair; and invoking, by the adjustment module, intelligent behaviors applied to or associated with the components of the matching pair according to the intelligent rules.

FIG. 1 schematically shows a CAD geometric modeling system according to certain embodiments of the present invention. As shown in FIG. 1, the system 100 includes a computing device 110 connected with a plurality of remote computing devices 140 via a network 120. In certain embodiments, at least one user may be capable of operating the system 100 directly through the computing device 110, or remotely through the computing device 110 from one of the remote computing devices 140 via the network 120. Each of the computing device 110 and the remote computing devices 140 can be a desktop computer, a laptop computer, a tablet, a mobile device or any other computing system that is capable of executing CAD related software applications directly or remotely. The network 120 may be a wired or wireless network, and may be of various forms such as an Internet, a Local Area Network (LAN), or a Wide Area Network (WAN).

The computing device 110 is a computing device which includes the necessary hardware and software components to perform the operation of the system 100. In certain embodiments, the computing device 110 includes, among other hardware and software components, a storage device 105, a memory 125 and a processor 135. In certain embodiments, the system 100 may include one computing device 110 as shown in FIG. 1, or may include multiple computing devices 110 to perform the operation of the system 100. For example, a plurality of computing devices 110 in a client-server structure may be provided to perform the operation of the system 100. In certain embodiments, the computing devices 110 may include one computer functioning as a server, and a plurality of mobile devices functioning as client machines connecting to the server through a network, such as Internet. In other words, the computer programs running on the system 100 may be running not only on one or more traditional computer systems, but also on various mobile devices that have computing capability or access to remote computing power through the network, such as Internet.

The processor 135 is a host processor which is configured to control operation of the computing device 110, and to execute the software applications for the computing device 110. In certain embodiments, the computing device 110 may run on more than one processor or central processing unit (CPU) as the host processor, such as two CPUs, four CPUs, eight CPUs, or any suitable number of CPUs.

The memory 125 may be a volatile memory, such as the random-access memory (RAM), for storing the data and information during the operation of the computing device 110. In certain embodiments, the memory 125 is in communication with the processor 135 through a system bus (not shown).

The storage device 105 may be a non-volatile data storage media for storing a CAD software 102, a CAE software 103, a data store 106, an operating system (OS) 108, and computer executable code 130 comprising a plurality of computer executable modules. In certain embodiments, the storage device 105 may store other software applications of the computing device 110.

The CAD software 102 may be a software application for the user to implement a geometric model for each of a plurality of components so as to create a CAD model of a geometric shape design, or to display an existing geometric shape design. For example, when the user is a CAD designer, the CAD designer may use the CAD software 102 at the computing device 110 to create a CAD geometric model of one or more components. On the other hand, when the user is a general user, the user may use the CAD software 102 to display the geometric model of the components or configure a product using existing components. In certain embodiments, the geometric model of each of the components is a solid shape model, a polygonal shape model, a point cloud set model, or a combination thereof. In other words, when a plurality of components exist, any two of the components may or may not be represented in the same type of model.

In certain embodiments, the CAD software 102 has a standard user interface (UI) 104, which is configured to receive one or more UI commands from the user. In certain embodiments, the standard UI 104 may receive the one or more UI commands based on user input. In certain embodiments, the UI commands may be a UI action to modify geometry, position or other information of a component, or may be a UI action to drag and drop a component. For example, when the user of the CAD software 102 selects and drags a component through the standard UI 104 of the CAD software 102, the standard UI 104 may generate a corresponding UI command based on the input (selecting and dragging) of the user. In certain embodiments, the user input may be performed by an input device (not shown) of the computing device 110. Examples of the input device may include, without being limited to, a keyboard, a mouse, a touching pad, virtual reality device, or any other input devices.

The CAE software 103 may be a software application to perform a CAE process. In certain embodiments, the CAE software 103 may be independent from the CAD software 102 and the computer executable code 130. In certain embodiments, the CAE software 103 and the CAD software 102 may be combined to form a package software. Examples of the CAE process may include, without being limited to, finite element analysis, stress analysis, thermal analysis, electromagnetics analysis, fluid dynamic analysis, kinematics analysis, collision analysis, dynamic analysis, or any other CAE process or simulation.

The data store 106 is a database configured to store a plurality of information of the system 100. Examples of the information may include, without being limited to, component information of the components, connector information of a plurality of connectors on the components, pairing rule information corresponding to a plurality of pairing rules, hierarchy rule information corresponding to a plurality of hierarchy rules, and intelligent rule information corresponding to a plurality of intelligent rules. As shown in FIG. 1, the data store 106 is located in the storage device 105 of the computing device 110. In certain embodiments, the data store 106 may be a virtual database which resides in one of the remote computing devices 140. Details of the connector information, pairing rule information, hierarchy rule information, and intelligent rule information stored in the data store 106 will be described later. The pairing rule information, the hierarchy rule information and the intelligent rule information may be predetermined or be obtained from a query result from the virtual database through the network. In certain embodiments, the data store 106 and the information stored therein may be in the form of hard coded information in computer software, an XML file or other file format, a real database on a database server or on a cloud server.

The OS 108 may be collective management software managing the operation of the computing device 110. For example, the OS 108 can include a set of functional programs that control and manage operations of the devices connected to the computing device 110. The set of application programs provide certain utility software for the user to manage the computing device 110. In certain embodiments, the OS 108 is operable to multitask, i.e., execute computing tasks in multiple threads, and may be operating system of different platforms, such as Microsoft Windows, Macintosh OSX, UNIX, LINUX, iOS, Android, etc.

The computer executable code 130 includes a plurality of computer executable modules. Each of the computer executable modules is a software module for performing certain operations to the geometric shape design. As shown in FIG. 1, the computer executable code 130 comprises a connector building module 112, a hierarchy module 114, a pairing module 116 and an intelligent behavior module 118. In certain embodiments, the intelligent behavior module 118 further comprises a geometric adjustment module 122, a constraint adding module 124, and other behavior modules 126. It should be noted that the computer executable code 130 may further include other additional computer executable modules, and these additional modules may be or may not be associated to or directly related to the present invention.

The connector building module 112 is a software module controlling creation of the connectors on the components. Each of the connectors is an object conceptually associated with a corresponding virtual location on the respective geometric model of a component. The connector may include configuration information pertaining to how the representative data of the geometric model of the component is to be configured on the display device relative to another component, and in some cases certain call back functionality for enabling the connector to access rules stored in the data store 106.

In certain embodiments, the connector building module 112, which is executable by the at least one computing device 110, is configured to add the connectors on the geometric model of the components. In certain embodiments, the connector building module 112 may assign certain names or identifications for each connector. In certain embodiments, the connector building module 112 may be configured to receive and apply certain naming or identification rules defined by a company so that each connector belongs to a certain group. The naming or identification rules may be stored in the data store 106. Only connectors in the same group may form a matching pair. This enables each company to have its own sets of connectors and they won't interact with connectors of other companies. Naming or identification rules for public groups can also be established which allow components from different sources to have interactions among them.

Figure 2A:
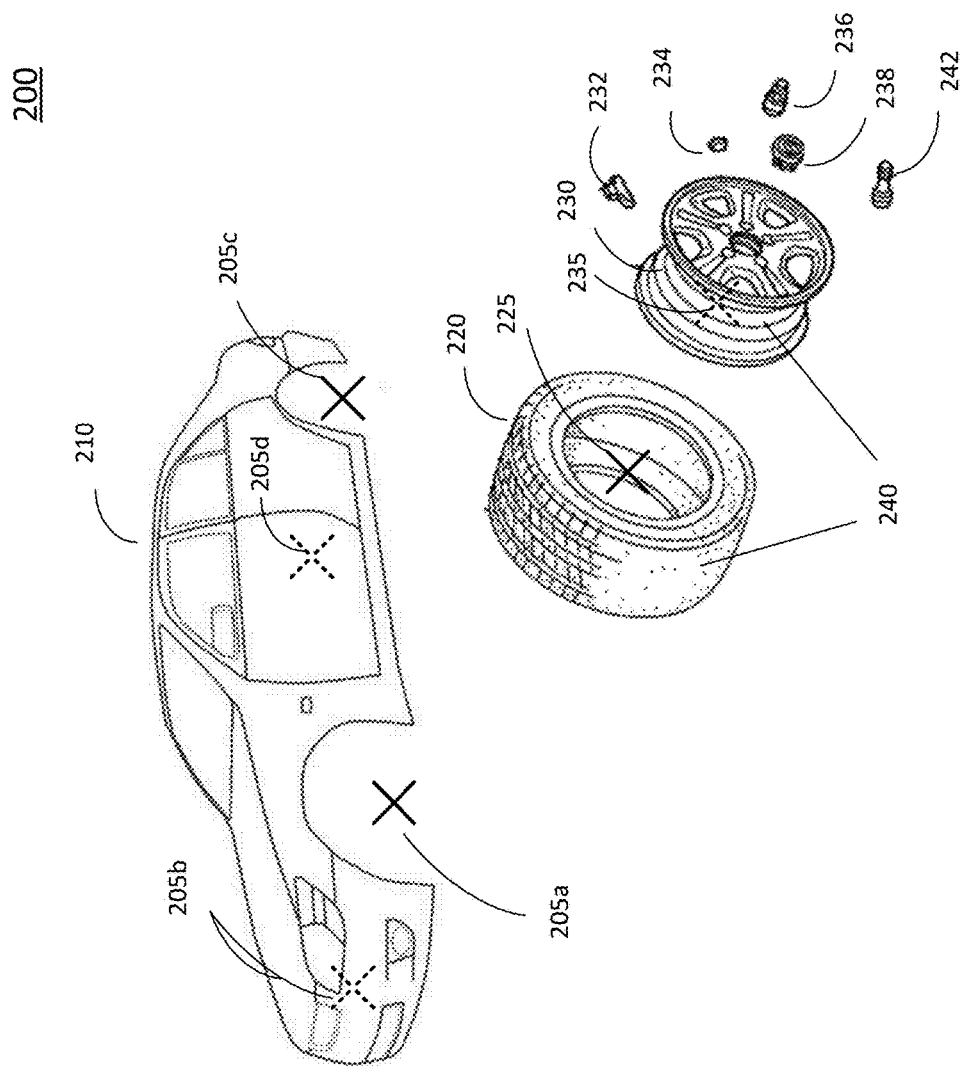
FIG. 2A schematically shows a vehicle system of a plurality of geometric design vehicle components according to certain embodiments of the present invention.

FIG. 2A schematically shows a car system of a plurality of geometric design vehicle components according to certain embodiments of the present invention. The connectors are shown as symbols "X" in FIG. 2A, which represents the 3D location of the connectors. It should be noted that the symbols "X" in FIG. 2A or any other figures of the disclosure are merely used to illustrate the connectors, and in actual implementation, the connectors may be shown by other symbols or representations, or may not be shown in the system 100.

In one embodiment, for example, the car system 200 comprises, among other things, a car body 210, at least one tire assembly 240 (an assembly of a tire 220 and a tire frame 230), and various screws 232, 234, 236, 238 and 242 used to assemble the tire 220 and the tire frame 230. Connectors can be added at one end of one of the car axles on the car body 210 as Axles_A 205*a*, Axles_B 205*b*, Axles_C 205*c* and Axles_D 205*d* respectively. Connectors can also be added at the center of the tire 220 and the tire frame 230 as Tire 225 and Frame 235 respectively.

In certain embodiments, besides adding connectors explicitly by the CAD designer, implicit connectors may be recognized by connector building module automatically based on the geometry of the components or other rules, and such implicit connectors may form matching pairs according to some UI actions.

The hierarchy module 114 is a software module determining and controlling what connectors on the hierarchical structures of components to be included in forming matching pair of connectors. In certain embodiments, the hierarchy module 114 is configured to determine the component levels in invoking connectors based on the hierarchical structures of the components.

In certain embodiments, the hierarchy module 114 is further configured to determine scope and priority of the connectors based on the hierarchy rules. Generally, for two components to be paired together, one component (e.g., the first component) may function as a movant component, and the other component (e.g., the second component) may function as a target component. Thus, the connectors at the movant component and the target component may be matched to form a matching pair. In certain embodiments, however, it is possible that the matching pair of the connectors is not formable because none of the connectors at the movant component and the target component are available to form the matching pair. In this case, the scope, which is the number of levels above or below the movant and target components, and priority of the connectors may be used to determine auxiliary connectors such that the matching pair can be formed using the auxiliary connectors.

In certain embodiments, the hierarchy module 114 is further configured to determine one of the identified second components to be the second component matching with the first component based on the hierarchy rules and the level of the components.

Using a car assembly as an example, a car can be a product assembly, which contains a body part, an engine sub-assembly, and four tire-wheel sub-assemblies, and each tire-wheel sub-assembly contains multiple parts (tire, wheel, screws, nuts, etc.). The car as a component is an above component of the tire-wheel sub-assembly, tire and wheel. The tire-wheel sub-assembly, tire and wheel are the below components of the car component. Connectors may belong to the different component, such as the car, the body part, the engine sub-assembly, the tire-wheel sub-assembly, or any of the parts of a sub-assembly. When an UI action drags/drops a movant component onto the wheel, the hierarchy module 114 may determine one of the car assembly, the tire-wheel sub-assemblies, or the wheel itself as the target component, and then invoke connectors and auxiliary connectors based on the hierarchical structures and the hierarchy rules.

FIGS. 2B and 2C schematically show a plurality of geometric design vehicle components of certain hierarchical structure levels with intelligent behaviors according to certain embodiments of the present invention. FIG. 2B shows a tire assembly 240 formed by a tire 220 and a tire frame 230, and FIG. 2C shows the tire assembly 240 matching to a car body 210. For example, as shown in FIG. 2B, for tire assembly 240, connector can be added as Wheel_Center 245. The connector Wheel_Center 245 for the tire assembly 240 is identified a connector of the tire assembly 240, which is an above component to the tire 220 and the tire frame 230. In other words, the tire 220 and the tire frame 230 are below components of the tire assembly 240. Further, for the tire 220 and the tire frame 230, the connectors Tire 225 of the tire 220 and Frame 235 of the tire frame 230 may also be added. Thus, as shown in FIG. 2C, when the tire assembly 240 is to be dragged and dropped to the car body 210, on which a connector Axles_A 205a of the car body has been identified, it is possible that one of the connectors (including the connector Wheel_Center 245 at the component level of the tire assembly 240, the connector Tire 225 at the component level of the tire 220, and the connector Frame 235 at the component level of the tire frame 230) on the tire assembly 240 may be used to form a matching pair with the connector Axles_A 205a.

The pairing module 116 is a software module for performing pairing operation of the components using the connectors and pairing rules stored in the data store 106. Pairing rules are a plurality of governing rules for pairing the connectors of the components, considering the relative priority of connectors at different levels among other considerations. In certain embodiments, the pairing module 116 is configured to access the pairing rules from the data store 106. For example, when the data store 106 is a virtual database located at the remote computing device 140, the pairing module 116 is configured to access the pairing rules from the virtual database through the network 120.

In certain embodiments, the pairing module 116 is configured to identify a first component (the movant component, for example, tire assembly 240), identify at least one second component capable of matching the first component (the target component, car body), identify one or more first connectors (Wheel_Center 245) on the first component and identify one or more all the possible matches of the second connectors (Axles_A 205a, Axles_B 205b, Axles_C 205c and Axles_D 205d) on the second component and match the first component to the second component (assembled tire assembly 240 with car body 210) by forming a matching pair of one of the identified first connectors and one of the identified second connectors based on the pairing rules.

In certain embodiments, the pairing module 116 is configured to identify the first component and the second component according to UI commands. In certain embodiments, the UI commands may be received by the standard UI 104 of the CAD software 102. For example, when the user of the CAD software 102 selects and drags a tire assembly 240 through the standard UI 104 of the CAD software 102, the standard UI 104 generates the UI commands based on the input of the user, and the UI commands are received by the pairing module 116. Thus, the pairing module 116 may identify the first component based on the UI commands.

In certain embodiments, when the pairing module 116 attempts to identify the one or more first connectors on the first component, the pairing module 116 may identify the one or more first connectors (Wheel_Center 245) on the first component (tire assembly 240). Then, the pairing module 116 may identify a plurality of first auxiliary connectors on one or more below components (e.g., tire 220 or tire frame 230) of the first component (tire assembly 240) according to the scope determined by the hierarchy module 114. In other words, each of the first auxiliary connectors is on a below component (the tire 220 or the tire frame 230) of the first component (the tire assembly 240) at a lower component level. Similarly, when the pairing module 116 attempts to identify the one or more second connectors on the second component to match with the first component, the pairing module 116 may identify the one or more second connectors (Axles_A 205a, Axles_B 205b, Axles_C 205c and Axles_D 205d) on the second component (car body 210). In certain embodiments, the pairing module 116 may identify a plurality of second auxiliary connectors on one or more above component (e.g., the whole car assembly) or on one or more below components (e.g., lower components of the car body, such as axles, which are not shown) of the second component (car body 210) according to the scope determined by the hierarchy module 114. In other words, each of the second auxiliary connectors is on a below component of the second component (the car body 210) at a lower component level, or on an above component of the second component (the car body 210) at a higher component level. The purpose of identifying the first auxiliary connectors and the second auxiliary connectors is to use these auxiliary connectors to increase the chance that at least one matching pair may be formed to match the first component (tire assembly 240) to the second component (car body 210).

Referring to FIG. 2C, when the pairing module 116 is to perform pairing of the tire assembly 240 with one end of one of the car axles of the car body 210, the connector Wheel_Center 245 of the tire assembly 240 and all possible connectors Axles_A 205a, Axles_B 205b, Axles_C 205c or Axles_D 205d of the car body 210 are found. By pairing the connector Wheel_Center 245 to one of the available connectors Axles_A 205a, the tire assembly 240 is automatically aligned with one end of one of the car axles of the car body. The selection of the second connector to pair with the first connector can be based on minimum distance between the two, or by other pairing rules. In certain embodiments, if the hierarchy module 116 determines that the auxiliary connectors are needed, the pairing module 116 may also identify the connector Tire 225 on the tire 220 and the connector Frame 235 on the tire frame 230 as the auxiliary connectors for the tire assembly 240. In this case, the tire assembly 240 may include one connector (Wheel_Center 245) and two auxiliary connectors (Tire 225 and Frame 235) to form the matching pair with the connectors on the car body 210.

In certain embodiments, when the matching pair of one of the identified first connectors and one of the identified second connectors is not formable based on the pairing rules, the pairing module 116 must use the auxiliary connectors to form the matching pair. In this case, the pairing module 116 is further configured to form the matching pair by selecting one of the identified first connectors and the identified first auxiliary connectors, and selecting one of the identified second connectors and the identified second auxiliary connectors, based on the priority determined by the hierarchy module and the pairing rules. In certain embodiments, the matching pair may be formed by matching one of the identified first connectors to one of the identified second auxiliary connectors. Alternatively, in certain embodiments, the matching pair may be formed by matching one of the identified first auxiliary connectors to one of the identified second connectors. In this way, the matching pair may be formed even if no pairing of connectors can be identified from the movant component and the target component.

For example, when pairing the tire assembly 240 on the car axles, if there is no connector in tire assembly 240 (e.g., the connector Wheel_Center 245 does not exist), the system can search connectors on the components comprised of the tire assembly 240, such as the tire 220 and the tire frame 230, then can use the connectors at the lower level components as auxiliary connectors to pair with the connectors at car body.

When multiple first connectors (or first connectors and first auxiliary connectors) are identified on the first component, or when multiple second connectors (or second connectors and second auxiliary connectors) are identified on the second component i.e., when there are multiple matching pairs of connectors, the pairing module 116 may highlight possible selections of matching pairs, show the chosen one based on minimum distance rule or by other pairing rules, and allow user interactively changing the matching pair of connectors. This is to enable manual overriding of existing rules. In the example that user performs the drag and drop action to drag the tire assembly 240 onto a car body 210, the four possible matching connectors Axles_A 205*a*, Axles_B 205*b*, Axles_C 205*c* and Axles_D 205*d* on the car body, one of them will pair with the connector Wheel_Center 245 of the tire assembly 240, to form a matching pair. The pairing module 116 may, based on the predetermined pairing rules, select the closest one (eg. Axles_A 205*a*) and highlight all four possibilities (all four possible connectors), and the pairing module 116 then positions the connector Wheel_Center 245 to the location of the chosen connector Axles_A 205*a*, so that the tire assembly 240 is paired with one end of the car axles on the car body 210. Meanwhile, since the user could see other highlighted alternative connectors, and the user may pick any one of the alternative connectors, the pairing module 116 may re-position the tire assembly 240 to the user desired place.

In certain embodiments, the pairing module 116 may be configured to list all of the formable matching pairs between the first connectors on the first component and the second connectors on the second component to allow a user to preview the matching result of each of the formable matching pairs and to select one of the formable matching pairs as the preferred matching pair. The list may be presented in a variety of formats. For example, a text list of all of the formable matching pairs with all the corresponding connectors may be shown through the UI to the user, such that the user may select one of the matching pairs on the text list to show the matching result.

In certain embodiments, any UI action moving or modifying a movant component (such as the drag and drop action to drag the movant component onto the target component, the push and pull action to a handle on the movant component and refer to some geometry on the target component, or editing any element on the movant component and refer to some geometry on the target component, etc.) may trigger the selection of matching pairs of connectors. Consequently, the intelligent behavior module 118 may be executed to perform the intelligent behavior according to the governing rules and information associated with the selected matching pair of connectors.

Figure 3:
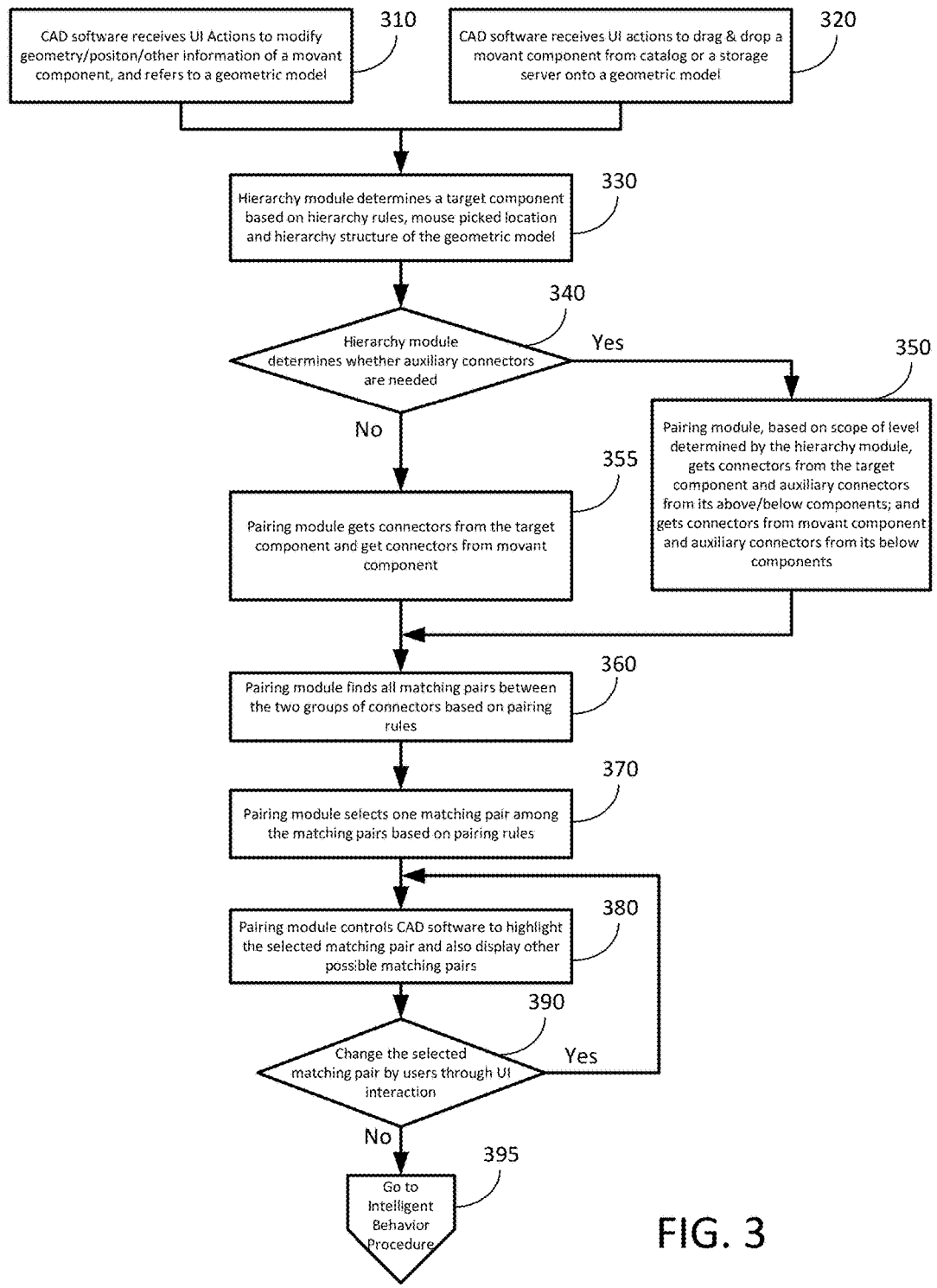
FIG. 3 shows a flowchart of the operation of forming a matching pair by the hierarchy module and the pairing module according to certain embodiments of the present invention.

FIG. 3 shows a flowchart of the operation of forming a matching pair by the hierarchy module and the pairing module according to certain embodiments of the present invention. It should be noted that the flowchart as shown in FIG. 3 merely shows certain embodiments of the operation of forming a matching pair by the hierarchy module 114 and the pairing module 116. In certain embodiments, the steps of the flowchart may be performed in different sequential orders to obtain similar results.

Generally, the operation of forming a matching pair starts with a UI command. For example, the CAD software 102 may receive one or more UI actions through the standard UI 104 to modify geometry, position or other information of a movant component, and refers to a geometric model (step 310). Alternatively, the CAD software 102 may receive one or more UI actions through the standard UI 104 to drag & drop a movant component from a catalog or a storage server onto a geometric model (step 320).

In response to the UI command, the hierarchy module 114 may determine a target component from a plurality of target component candidates based on the hierarchy rules obtained from the data store 106, mouse picked location of the UI actions, and a hierarchical structure of the geometric model (step 330). Then, based on the hierarchy rules obtained from the data store 106, the hierarchy module 114 determines whether auxiliary connectors are needed for the operation of forming the matching pair (step 340).

If the hierarchy module 114 determines that the auxiliary connectors are needed, the pairing module 116, based on the scope of level determined by the hierarchy module 114, may get a plurality of connectors from the target component and auxiliary connectors from its above/below components; and get a plurality of connectors from movant component and auxiliary connectors from its below components (step 350).

On the other hand, if the hierarchy module 114 determines that the auxiliary connectors are not necessary, the pairing module 116 may get the connectors from the target component and get the connectors from movant component (step 355), without getting any auxiliary connectors from either the target component or the movant component.

Once the two groups of connectors used for the operation of forming the matching pair are obtained, the pairing module 116 may then find all matching pairs between the two groups of connectors based on the pairing rules (step 360). Then, the pairing module 116 may select one matching pair among the matching pairs based on the pairing rules (step 370) as a default matching pair.

Once a matching pair is selected, the pairing module 116 may control the CAD software 102 to highlight the selected matching pair, and also display other possible matching pairs (step 380). The highlighting and displaying of the matching pairs may be performed on a display such that the user may determine whether the selected matching pair is a preferred matching pair. The user may then choose to or not to change the selected matching pair through UI interaction (step 390). If the user chooses to change the selected matching pair at step 390, the system 100 goes back to step 380 such that the pairing module 116 may again control the CAD software 102 to highlight the user-selected matching pair, and also display other possible matching pairs. Alternatively, if the user chooses not to change the selected matching pair, the matching pair is formed, and then the system 100 may go to the intelligent behavior procedure (step 395), which will be described later.

Referring back to FIG. 1, the intelligent behavior module 118 is configured to receive the intelligent rules for the intelligent behaviors of the components of the matching pair and invoke intelligent behaviors applied to or associated with the components of the matching pair according to the intelligent rules. In certain embodiments, the intelligent behavior module 118 is configured to access the intelligent rules from the data store 106. For example, when the data store 106 is a virtual database located at the remote computing device 140, the intelligent behavior module 118 is configured to access the intelligent rules from the virtual database through the network 120.

The intelligent rules are a plurality of governing rules and constraints for the intelligent behaviors of the components of the matching pair, which are associated with connectors, and may include: geometric rules (position, orientation, size, etc.), procurement constraints (price, inventory, schedule, etc.), engineering rules (simulation or design intend, etc.), manufacturing rules (manufacturing process information, design for manufacturing and assembly rules, materials, etc.), business rules, and other customized rules and information. In certain embodiments, each of the intelligent rules may be stored as a part of the intelligent rule information in the data store 106. When the data store 106 is a virtual database located at the remote computing device 140, the intelligent behavior module 118 is configured to access the intelligent rules from the virtual database through the network 120.

In certain embodiments, the intelligent behaviors information stored at the connectors that are invoked by the intelligent behavior module following the intelligent rules may include, without being limited to: invoking the CAE software 103 to perform the CAE process; communicating with outside resources, adjusting the matched pairing components (positioning, modifying sizes, establishing constraints between the components, etc.), adjusting the designing of the components; invoking cloud computing and invoking expert analysis.

In certain embodiments, the intelligent behavior module 118 further includes a geometric adjustment module 122 configured to perform an operation to the components of the matching pair, which includes: positioning the first component in association to a location of the one of the identified second connectors; modifying the geometric data (size, shape, etc.) of the first and second components related to the matching pair based on the intelligent rules.

In certain embodiments, the intelligent behavior module 118 further includes a constraint adding module 124 configured to perform an operation to the components of the matching pair, which includes: establishing one or more constraint relationships between the first and second components related to the matching pair based on the intelligent rules.

Figure 4:
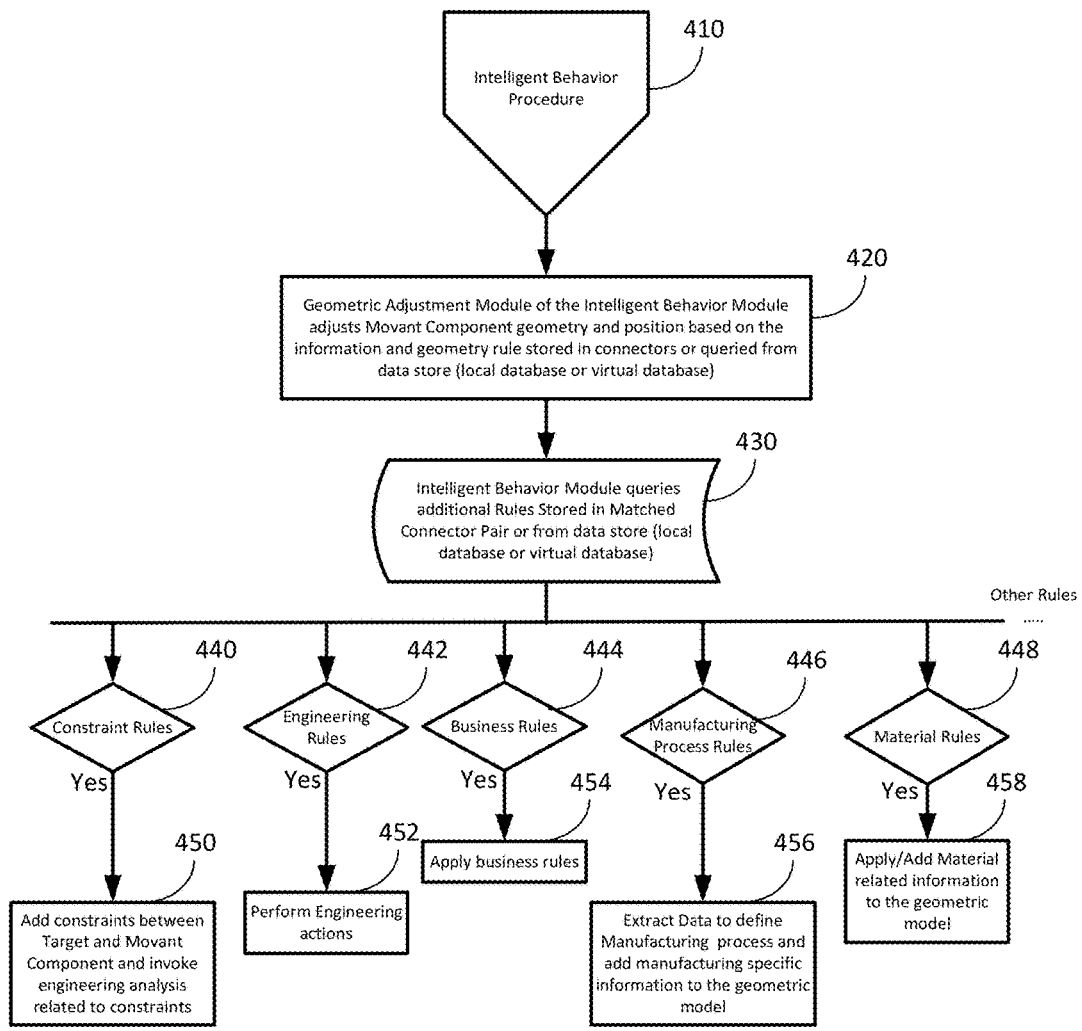
FIG. 4 shows a flow chart of the operation of the intelligent behavior module according to certain embodiments of the present invention.

FIG. 4 shows a flow chart of the operation of the intelligent behavior module according to certain embodiments of the present invention. It should be noted that the flowchart as shown in FIG. 4 merely shows certain embodiments of the operation of the intelligent behavior module 118. In certain embodiments, the steps of the flowchart may be performed in different sequential orders to obtain similar results.

As shown in FIG. 4, when the intelligent behavior procedure starts (step 410), the geometric adjustment module 122 of the intelligent behavior module 118 adjusts the geometry and position of the movant component based on the information and the geometry rule stored in the connectors or queried from the data store 106 (e.g., the local database or the virtual database through the network) (step 420). Then, the intelligent behavior module 118 may query additional rules stored in the matched connector pair or from the data store 106 (e.g., the local database or the virtual database through the network) (step 430). The additional rules may include, without being limited to, constraint rules (step 440), engineering rules (step 442), business rules (step 444), manufacturing process rules (step 446), material rules (step 448), and other rules. It should be noted that the intelligent behavior module 118 may query one or more additional rules to apply.

When the intelligent behavior module 118 determines at step 440 that the constraint rules may apply, the intelligent behavior module 118 may add constraints between the target component and the movant component, and invoke engineering analysis related to the constraints (step 450).

When the intelligent behavior module 118 determines at step 442 that the engineering rules may apply, the intelligent behavior module 118 may perform the engineering actions based on the engineering rules (step 452).

When the intelligent behavior module 118 determines at step 444 that the business rules may apply, the intelligent behavior module 118 may perform actions by applying the business rules (step 454).

When the intelligent behavior module 118 determines at step 446 that the manufacturing process rules may apply, the intelligent behavior module 118 may perform actions to extract data to define a manufacturing process, and add manufacturing specific information to the geometric model based on the manufacturing process rules (step 456).

When the intelligent behavior module 118 determines at step 448 that the material rules may apply, the intelligent behavior module 118 may apply or add material related information to the geometric model based on the material rules (step 458).

Several examples of applying intelligent rules to invoke intelligent behaviors by the intelligent behavior module 118 are provided as follows according to certain embodiments of the present invention. It should be appreciated that the examples are merely provided as embodiments of the present invention, without limiting the intelligent rules or the intelligent behaviors invoked by the intelligent behavior module 118.

Example 1: UI Action to Modify a Component Geometry

Figure 5:
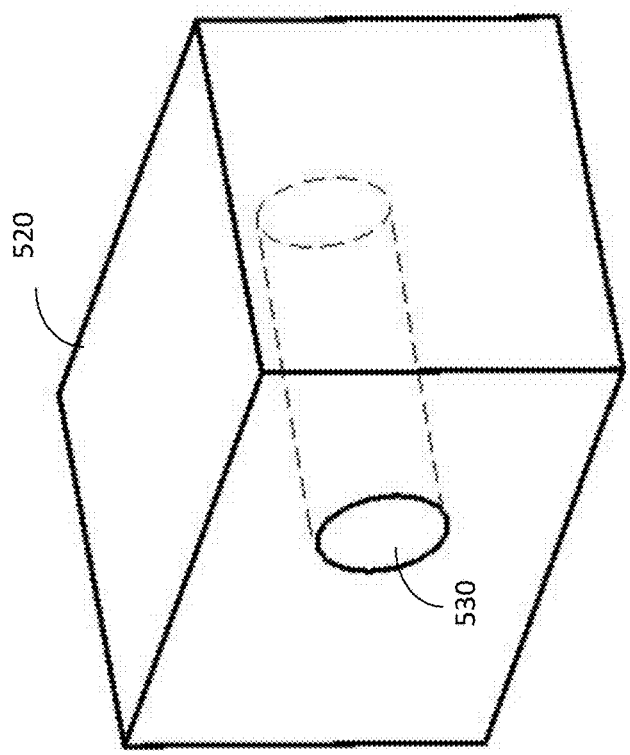
FIG. 5 schematically shows a plurality of geometric design components with intelligent behaviors based on geometric rules according to certain embodiments of the present invention.
Figure 5:
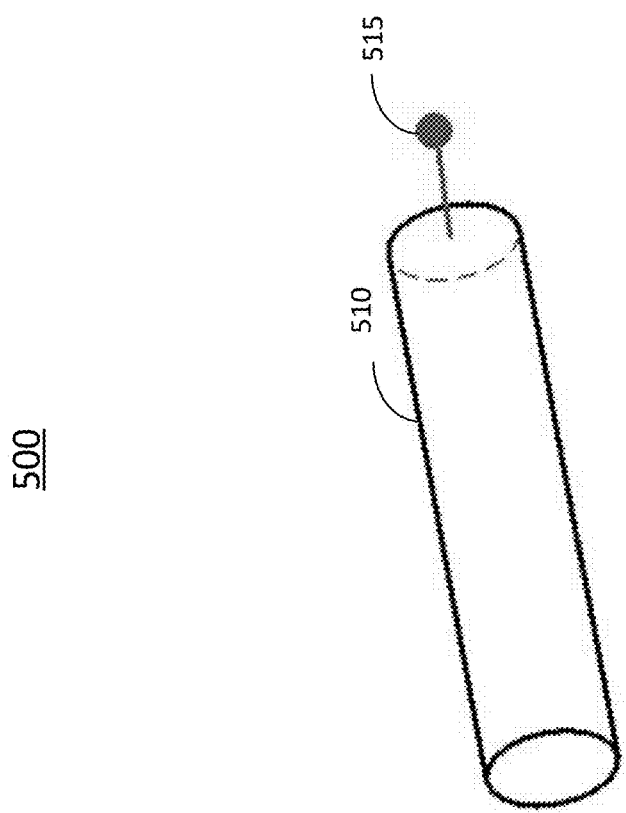

FIG. 5 schematically shows a plurality of geometric design components with intelligent behaviors based on geometric rules according to certain embodiments of the present invention. As shown in FIG. 5, the components include a cylinder part 510 and a block part 520, and a hole 530 exists on the block part 520. Assume that a user wants to extend the cylinder length of the cylinder part 510 to match the bottom of the hole 530 on the block part 520. The bottom of the hole 530 may be hidden on the far side of the block part 520 and is thus difficult to reach, or the UI device, such as a touch screen, makes it difficult to precisely picking it. In order to facilitate the process, the user can use the connector building module 112 to create a connector at the bottom of the hole 530, create a connector at the top of the cylinder part 510, and define the connector information of the two connectors created so that they will be identified as a matching pair. When the user drags a handle 515 at the top of the cylinder part 510, in this case the cylinder part 510 is the movant component, to hit anywhere on the block part 520, the hierarchy module 114 first determines the block part 520 as the target component. Then the pairing module 116 determines the matching pair of the connectors. Then the geometric adjustment module 122 of the intelligent behavior module 118 will adjust the cylinder length of the cylinder part 510 based on the information defined in connector or queried from data store 106 (e.g., the local database or the virtual database through the network), and then align the top of the cylinder part 510 to the bottom of the hole 530.

Example 2: Geometric Rules and Engineering Rules

Figure 6:
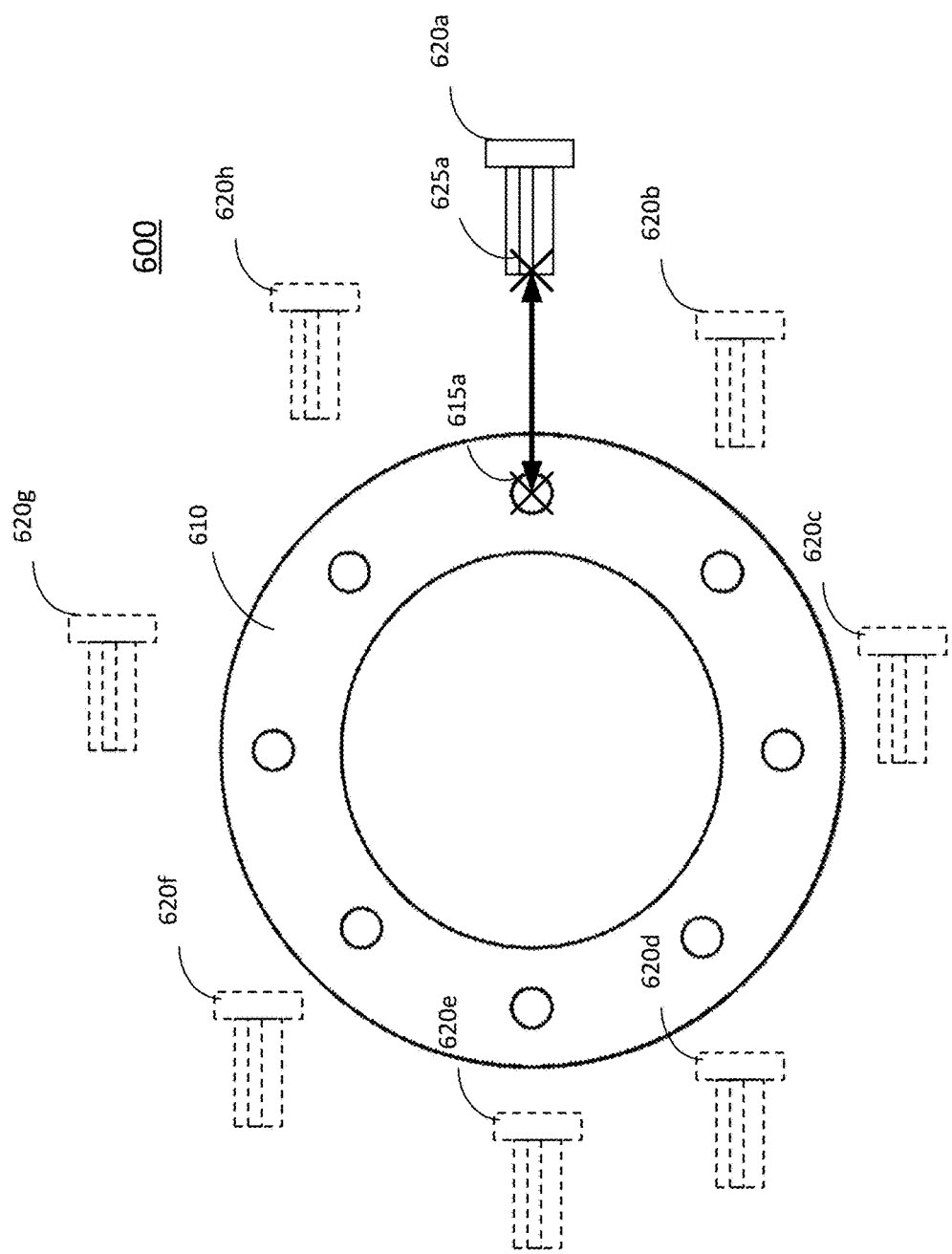
FIG. 6 schematically shows a plurality of geometric design components with intelligent behaviors based on geometric rules and engineering rules according to certain embodiments of the present invention.

FIG. 6 schematically shows a plurality of geometric design components with intelligent behaviors based on geometric rules and engineering rules according to certain embodiments of the present invention. When a user drags and drops a screw 620a to a ring shaped part 610 having eight screw holes, geometric rules are applied by the geometric adjustment module 122 of the intelligent behavior module 118, and engineering rules are also applied by the associated other behavior modules 126 of the intelligent behavior module 118. A connector Screw 625a may be added to the screw 620a, and connector Screw_Hole 615a is added to the screw hole as shown in FIG. 6. The geometric adjustment module 122 utilizes the information stored in connector Screw 625a on the screw 620a and in connector 615a on the ring 610 to decide the size and length of the screw 620a and aligns it to the connector Screw_Hole 615a, by applying the geometric pairing rules. Other engineering rules can also be invoked, such as an "automatic repeating engineering rule" among others. The automatic repeating engineering rule may be applied by the associated other behavior module 126, after a matching pair has been identified and processed, to search for similar features on the target component and automatically add same movant components to form similar matching pairs. In this particular example of engineering rule shown in FIG. 6, after a fastener matches a hole is completed, the associated other behavior module 126 applies the automatic repeating engineering rule to search similar holes on the ring part 610 and apply additional fasteners to these holes. In this example, it will create seven additional screws 620b-620h, which automatically fit into the corresponding seven other screw holes similar to the screw hole having the connector Screw_Hole 615a. It should be noted that the automatic fitting of the additional screws 620b-620h and the holes may or may not necessarily use pairing of connectors. The automatic repeating engineering rule may also specify other conditions such as whether the size of the holes should be the same, or the orientation of the holes should be the same, etc.

Example 3: Constraint Rules

Figure 7:
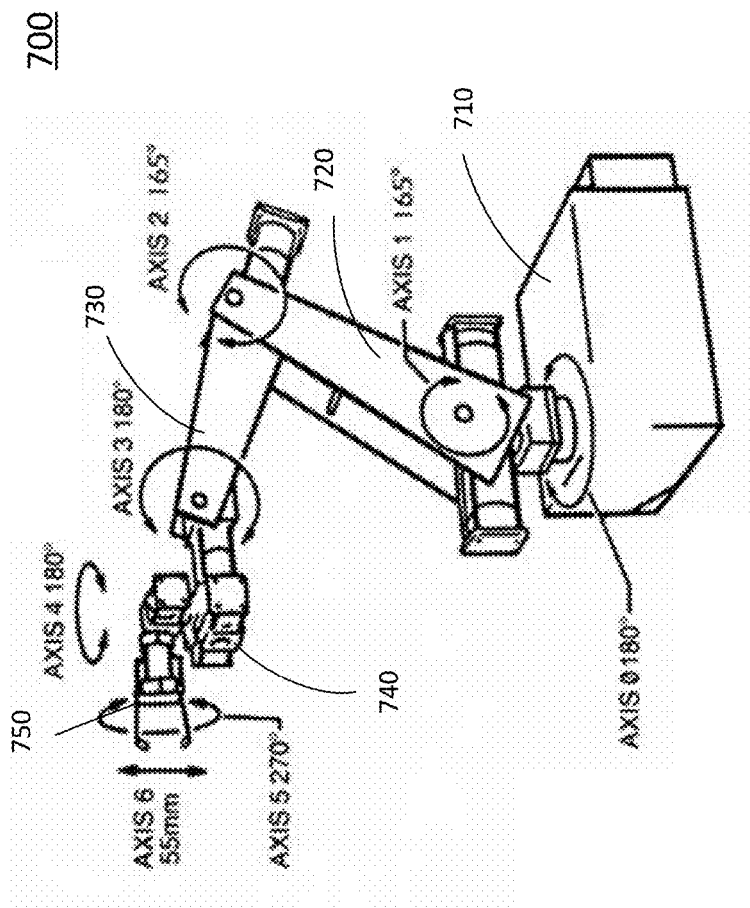
FIG. 7 schematically shows a plurality of geometric design components on a robot arm with intelligent behaviors based on constraint rules according to certain embodiments of the present invention.

An example of applying constraint rules by the intelligent behavior module 118 is shown in FIG. 7. FIG. 7 schematically shows a plurality of geometric design components on a robot arm with intelligent behaviors based on constraint rules according to certain embodiments of the present invention. As shown in FIG. 7, the robot arm has components such as a shoulder 710, an upper arm 720, a forearm 730, a hand 740 and fingers 750. Each component is connected to at least one other component. For example, the upper arm 720 is connected to the shoulder 710, the forearm 730 is connected to the upper arm 720, the hand 740 is connected to the forearm 730, and the fingers 750 are connected to the hand 740. The components of the robot also need to satisfy many engineering constraints such as motion constraints between these components. For instance, the rotating angles for each of the rotating axes may have certain ranges. As shown in FIG. 7, the upper arm 720 is capable of rotating with respect to the shoulder 710 around AXIS 0 between 0-180° and around AXIS 1 between 0-165°. The forearm 730 is capable of rotating with respect to the upper arm 420 around AXIS 2 between 0-165°. The hand 740 is capable of rotating with respect to the forearm 730 around AXIS 3 between 0-180°. Further, the finger 750 is capable of rotating with respect to the hand 740 around AXIS 4 between 0-180° and around AXIS 5 between 0-270°, and translating along AXIS 6 direction in the range of 0-55 mm.

In certain embodiments, connectors may be created at the joint locations of each component with additional motion constraint rules such as ones described above. For example, when one robot component (as the movant component) is dropped to another robot component, the hierarchy module 114 first determines the hit robot component as the target component, then the pairing module 116 determines the matching pair of the connectors. Then, the geometric adjustment module 122 of the intelligent behavior module 118 will adjust the position of the movant component (and may adjust the geometry of the movant component). Then, the constraint adding module 124 is invoked to apply the motion constraints between the two components based on the constraints rules so that the components can only move or rotate in certain directions within certain ranges with respect to each other.

Other constrain rules such as the maximum load that the robot can carry and creating load conditions automatically can be defined and invoked to launch additional engineering simulation analysis such as FEA, kinematic/physical simulation or collision detection, etc in a separate CAE software or in the CAD software.

Example 4: Business Rules

Figure 8:
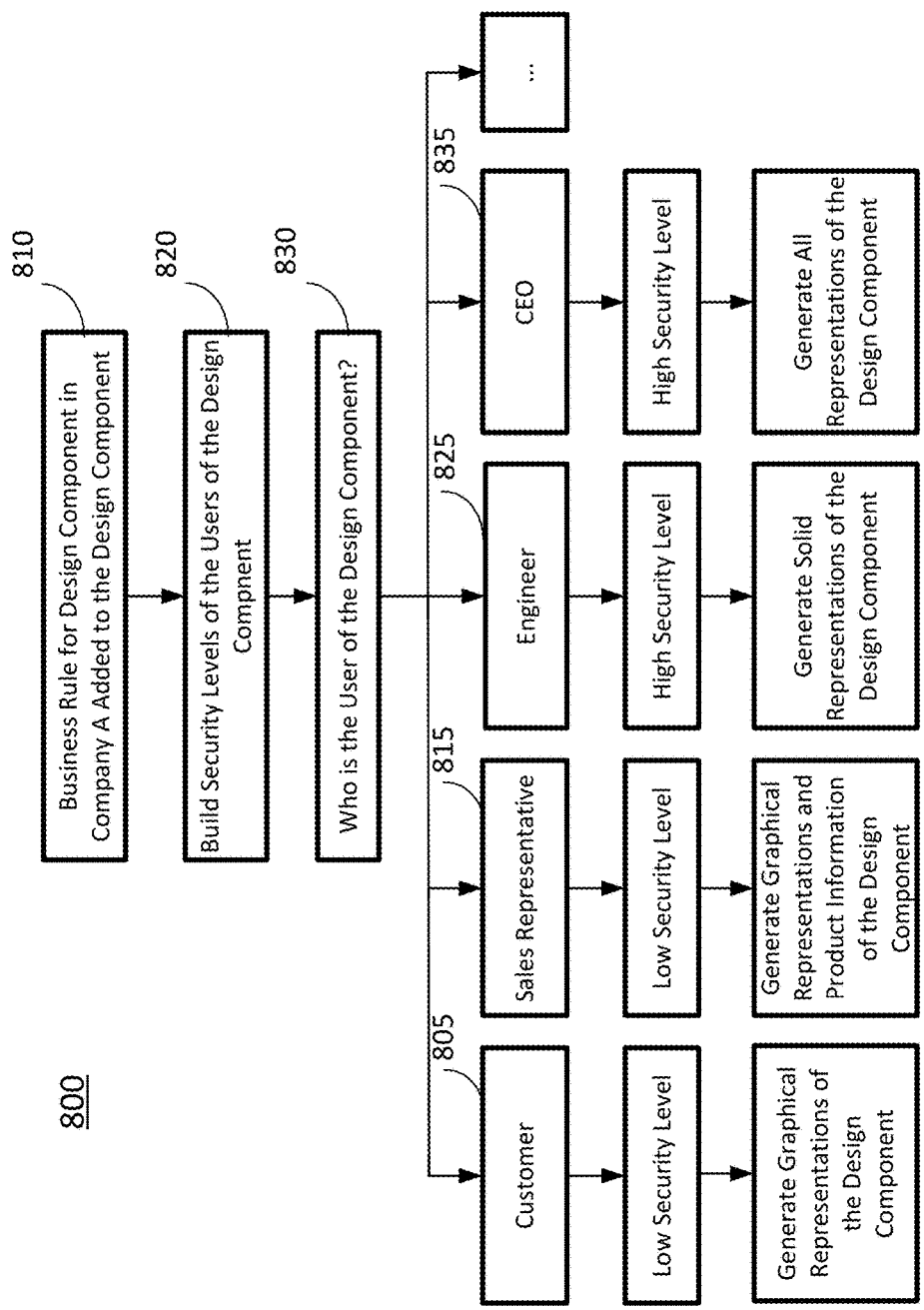
FIG. 8 schematically shows an example of application of business rule according to certain embodiments of the present invention.

FIG. 8 schematically shows an example of application of business rule according to certain embodiments of the present invention. An example of applying business rules by the intelligent behavior module 118, referring to FIG. 8, is that many intellectual properties of company A are embedded in a design component provided by a content provider. Business rule can be added to a design component to decide what type of information will be generated or exposed to users based on a particular usage of this component and the security level of the users. For instance, after a business rule for a design component from company A is added to the design component at Step 810, the business rule allocates security levels of the users of the design component of company A at Step 820. The business rule then decides who the current user of the design component is at Step 830. If a design component is used to configure a product to present to a customer 805, the business rule decides that the user security level is low, thus generates the graphical representations of the design component instead of the solid representations to avoid leaking trade secrets, or accidental modification of the design component. If the design component is used to configure a product for a sales representative 815 of company A to present to a potential customer, the business rule decides that the user security level is low, thus generates the graphical representations and corresponding product information of the design component such as pricing. If the design component is used to design the product by an engineer 825 from company A, the business rule decides that the user security level is high, thus allows the engineer to customize certain designs of the design component, and the business rule creates solid representations of the design component. There can be other users such as CEO 835, etc., the business rule decides security level for each of the users and the corresponding accessibility to the intellectual property information of the design component.

Example 5: Manufacturing Process Rules

Regarding to manufacturing process rules, connectors can include manufacturing process information to produce a component. Manufacturing process rules may specify operations, operation sequence as well as detailed sets of instructions including critical measurement dimensions related to individual operations, machining parameters, set-up instructions, and quality assurance checkpoints etc. These rules can be invoked to extract data to specify manufacturing process of the movant component and check whether the movant component can be manufactured by the specified manufacturing process. Other manufacturing related rule may be invoked to assign manufacturing related information such as surface finish on the surfaces of the movant component or the target component. These data will be obtained from the component later to facilitate the manufacturing process planning such as create engineering drawing, generate NC code automatically and send NC code to the machines in machine shop.

Example 6: Materials Rules

Choosing the material of a component is tied to the required functions, loading and other external conditions. Materials rules such as "same material rule", or "less wear material" can also be invoked to assign material property of a movant component after a target component and matching connector pair is determined. The "same material rule" may be applied to assign the same material to movant component as the one in target component. The "less wear material" may be applied to assign the movant component a material that is less wearable than the target component so that the movant component can be replaced easily and the expensive target component will never be wore and damaged during the life-cycle of the product.

Figure 9:
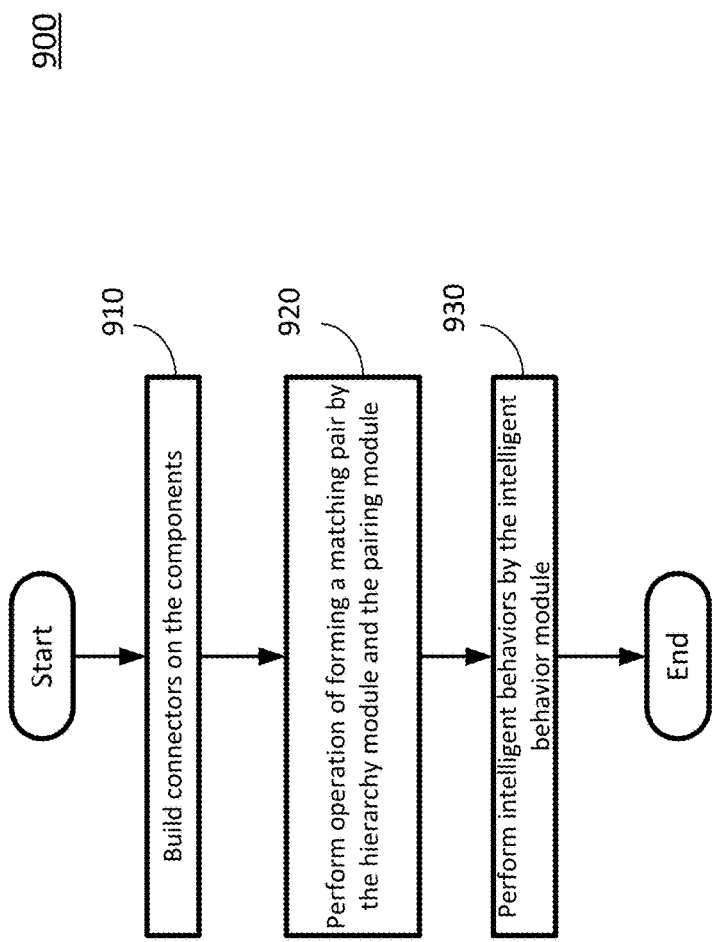
FIG. 9 shows a flowchart of a computer-implemented method of performing geometric modeling on a computer-aided design (CAD) software according to certain embodiments of the present invention.

Another aspect of the present invention relates to a computer-implemented method of performing geometric modeling on a computer-aided design (CAD) software. FIG. 9 shows a flowchart of a computer-implemented method of performing geometric modeling on a CAD software according to certain embodiments of the present invention. In certain embodiments, the computer-implemented method may be performed by the system 100 as shown in FIG. 1.

As shown in FIG. 9, in certain embodiments, the system adds a plurality of connectors on a plurality of components by a connector building module (step 910). Then, the system performs operation of forming a matching pair by the hierarchy module 114 and the pairing module 116. Details of the operation of forming a matching pair by the hierarchy module 114 and the pairing module 116 have been described with respect to the flowchart of FIG. 3. Then the system performs the intelligent behaviors by the intelligent behavior module 118. Details of the operation of the intelligent behavior module have been described with respect to the flowchart of FIG. 4 and the examples as stated above.

Another aspect of the present invention relates to a non-transitory computer readable medium storing computer executable code 130. In one embodiment, the computer executable code 130, when executed at a processor, is configured to: add a plurality of connectors on a plurality of components, wherein the CAD software is configured to implement a geometric model for each of the plurality of components, and a data store is configured to store component information of the components, connector information of the connectors on the components, pairing rule information, and intelligent rule information; identify a first component; identify at least one second component capable of matching the first component; identify one or more first connectors on the first component and one or more second connectors on the second component; match the first component to the second component by forming a matching pair of one of the identified first connectors and one of the identified second connectors based on the pairing rules; receive the intelligent rules for the intelligent behaviors of the components of the matching pair; and invoke intelligent behaviors applied to or associated with the components of the matching pair according to the intelligent rules. In certain embodiments, the non-transitory computer readable medium may include, but not limited to, any physical or virtual storage media. In certain embodiments, the non-transitory computer readable medium may be implemented as the storage device 105 of the computing device 110 as shown in FIG. 1.

The technology of the embodiments of the present invention may be implemented by software running on any kind of computers, mobile devices such as tablet or cell phone; and the interactive UI actions may be drag and drop, push and pull handles or any other actions that are conducted using mouse, touch screen, virtual reality devices, or any other devices.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. For example, multiple probes may be utilized at the same time to practice the present invention. Accordingly, the scope of the present invention is defined by the appended claims rather than the foregoing description and the exemplary embodiments described therein.

What is claimed is:

1. A computer-aided design (CAD) geometric modeling system, comprising:
 a CAD software executable by at least one computing device, configured to implement a geometric model for each of a plurality of components;
 a data store configured to store component information of the components, connector information of a plurality of connectors on the components, pairing rule information corresponding to a plurality of pairing rules, and intelligent rule information corresponding to a plurality of intelligent rules, wherein each of the connectors is an object assigned with a particular predetermined group of a plurality of predetermined groups and defined to be associated with a corresponding virtual location on the geometric model of each of the components, the pairing rules are rules governing pairing of the connectors, the intelligent rules are rules for applying additional actions as intelligent behaviors to the components of a matching pair, and the pairing rules and the intelligent rules are respectively associated with the connectors;

a connector building module executable by the at least one computing device, configured to add the connectors on the components explicitly by a CAD designer, or implicitly recognized by the connector building module automatically based on a geometry of the geometric model of each of the components or other rules;

a pairing module executable by the at least one computing device, configured to:
  identify a first component;
  identify at least one second component capable of matching the first component;
  identify a plurality of first connectors on the first component and a plurality of second connectors on the second component, wherein the plurality of first connectors and the plurality of second connectors are assigned with the same predetermined group and form a plurality of formable matching pairs, and the formable matching pairs are formed only by the first connectors and the second connectors assigned with the same predetermined group; and
  match the first component to the second component by selecting, from the plurality of formable matching pairs, a selected matching pair using one of the identified first connectors and one of the identified second connectors based on the pairing rules; and an intelligent behavior module executable by the at least one computing device, configured to:
  receive the intelligent rules associated with the one of the identified first connectors and the one of the identified second connectors of the selected matching pair to apply the intelligent behaviors to the components of the selected matching pair; and
  invoke the intelligent behaviors applied to the components of the selected matching pair according to the intelligent rules associated with the one of the identified first connectors and the one of the identified second connectors of the selected matching pair.

2. The CAD geometric modeling system of claim 1, wherein the geometric model of each of the components is a solid shape model, a polygonal shape model, a point cloud set model, or a combination thereof.

3. The CAD geometric modeling system of claim 1, further comprising:
a hierarchy module executable by the at least one computing device, configured to:
  determine a plurality of levels of the components having the plurality of connectors thereon based on hierarchical structures of the components;
  determine one of the identified second components to be the second component matching with the first component based on a plurality of hierarchy rules and the levels of the components; and
  determine scope and priority of the plurality of connectors based on the hierarchy rules and the hierarchical structures,
  wherein the data store further stores hierarchy rule information corresponding to the hierarchy rules.

4. The CAD geometric modeling system of claim 3, wherein the pairing module is configured to identify the plurality of first connectors on the first component and the plurality of second connectors on the second component by:
  identifying the plurality of first connectors on the first component;
  identifying a plurality of first auxiliary connectors on one or more below components of the first component according to the scope determined by the hierarchy module and the hierarchical structures;
  identifying the plurality of second connectors on the second component; and
  identifying a plurality of second auxiliary connectors on one or more above components and one or more below components of the second component according to the scope determined by the hierarchy module and the hierarchical structures.

5. The CAD geometric modeling system of claim 4, wherein the pairing module is configured to form the selected matching pair by:
  selecting the one of the identified first connectors and one of the identified first auxiliary connectors, and selecting the one of the identified second connectors and one of the identified second auxiliary connectors, based on the priority determined by the hierarchy module and the pairing rules.

6. The CAD geometric modeling system of claim 1, wherein the pairing module is configured to identify the first component and the second component according to user interface (UI) commands.

7. The CAD geometric modeling system of claim 1, wherein the pairing module is further configured to:
  when the plurality of first connectors is identified on the first component as possible connector candidates to form the selected matching pair, control the CAD software to highlight one or more of the identified first connectors on the first component.

8. The CAD geometric modeling system of claim 7, wherein the pairing module is further configured to:
  list all of the formable matching pairs between the first connectors on the first component and the second connectors on the second component to allow a user to preview the matching result of each of the formable matching pairs and to select one of the formable matching pairs as the selected matching pair.

9. The CAD geometric modeling system of claim 1, wherein the data store is a local database which resides in the at least one computing device.

10. The CAD geometric modeling system of claim 1, wherein the data store is a virtual database which resides in a remote computing device, wherein the remote computing device is remotely connected to the at least one computing device through a network.

11. The CAD geometric modeling system of claim 10, wherein the network is an Internet, a Local Area Network (LAN), or a Wide Area Network (WAN).

12. The CAD geometric modeling system of claim 10, wherein the pairing module is further configured to access the pairing rules from the virtual database through the network.

13. The CAD geometric modeling system of claim 1, wherein the received intelligent rules for the intelligent behaviors of the components of the selected matching pair comprises: geometric data, procurement data, engineering and manufacturing rules, business rules, design for manufacturing and assembly rules, manufacturing process information, materials rules, and other customized rules and information.

14. The CAD geometric modeling system of claim 13, wherein the intelligent behavior module further comprises:
  a geometric adjustment module executable by the at least one computing device, configured to perform an operation to the components of the selected matching pair, wherein the operation comprises:

positioning the first component in association to a location of the one of the identified second connectors; and modifying the geometric data of the first and second components related to the selected matching pair based on the intelligent rules.

15. The CAD geometric modeling system of claim 13, wherein the intelligent behavior module further comprises:
a constraint adding module executable by the at least one computing device, configured to perform an operation to the components of the selected matching pair, wherein the operation comprises:
establishing one or more constraint relationships between the first and second components related to the selected matching pair based on the constraint rules.

16. The CAD geometric modeling system of claim 13, further comprising a computer-aided engineering (CAE) software to perform a CAE process, wherein the CAE process comprises finite element analysis, stress analysis, thermal analysis, electromagnetics analysis, fluid dynamic analysis, kinematics analysis, collision analysis, and dynamic analysis.

17. The CAD geometric modeling system of claim 16, wherein the intelligent behavior module further comprises:
other behavior modules executable by the at least one computing device, configured to perform an operation to the components of the selected matching pair, wherein the operation comprises:
invoking the CAE software to perform the CAE process;
communicating with outside resources;
adjusting designing of the components;
invoking cloud computing; and
invoking expert analysis.

18. The CAD geometric modeling system of claim 1, wherein for any two of the formable matching pairs, a first set of intelligent rules of the intelligent rules associated with a first one of the plurality of first connectors and a first one of the plurality of the second connectors that form one of the two of the formable matching pairs and a second set of intelligent rules of the intelligent rules associated with a second one of the plurality of first connectors and a second one of the plurality of the second connectors that form the other of the two of the formable matching pairs are different.

19. The CAD geometric modeling system of claim 1, wherein the intelligent rules comprise geometry rules and additional rules, and the intelligent behaviors invoked by the intelligent behavior module comprise:
adjusting geometry and position of the first component based on the geometry rules; and
performing one or more additional non-geometric, non-positional behaviors based on the additional rules,
wherein the additional rules are non-geometric, non-positional rules comprising:
engineering rules, business rules, manufacturing process rules, and material rules.

20. The CAD geometric modeling system of claim 19, wherein the one or more additional non-geometric, non-positional behaviors are performed after adjusting the geometry and position of the first component based on the geometry rules.

21. A computer-implemented method of performing geometric modeling using at least one computing device, the method comprises:
adding, by a connector building module executable by the at least one computing device, a plurality of connectors on a plurality of components explicitly by a CAD designer, or implicitly recognized by the connector building module automatically;

implementing, by a computer-aided design (CAD) software executable by the at least one computing device, a geometric model for each of the plurality of components;

storing component information of the components, connector information of the connectors on the components, pairing rule information corresponding to a plurality of pairing rules, and intelligent rule information corresponding to a plurality of intelligent rules on a data store, wherein each of the connectors is an object assigned with a particular predetermined group of a plurality of predetermined groups and defined to be associated with a corresponding virtual location on the geometric model of each of the components, the pairing rules are rules governing pairing of the connectors, the intelligent rules are rules for applying additional actions as intelligent behaviors to the components of a matching pair, and the pairing rules and the intelligent rules are respectively associated with the connectors;

identifying, by a pairing module executable by the at least one computing device, a first component;

identifying, by the pairing module, at least one second component capable of matching the first component;

identifying, by the pairing module, a plurality of first connectors on the first component and a plurality of second connectors on the second component, wherein the plurality of first connectors and the plurality of second connectors are assigned with the same predetermined group and form a plurality of formable matching pairs, and the formable matching pairs are formed only by the first connectors and the second connectors assigned with the same predetermined group;

matching, by the pairing module, the first component to the second component by selecting, from the plurality of formable matching pairs, a selected matching pair using one of the identified first connectors and one of the identified second connectors based on the pairing rules;

receiving, by an intelligent behavior module executable by the at least one computing device, the intelligent rules associated with the one of the identified first connectors and the one of the identified second connectors of the selected matching pair to apply the intelligent behaviors to the components applied to the selected matching pair; and invoking, by the intelligent behavior module, the intelligent behaviors applied to the components of the selected matching pair according to the intelligent rules associated with the one of the identified first connectors and the one of the identified second connectors of the selected matching pair.

22. The computer-implemented method of claim 21, further comprising:
determining, by a hierarchy module executable by the at least one computing device, a plurality of levels of the components having the plurality of connectors thereon based on hierarchical structures of the components;
determining, by the hierarchy module, one of the identified second components to be the second component matching with the first component based on a plurality of hierarchy rules and the levels of the components; and
determining, by the hierarchy module, scope and priority of the plurality of connectors based on the hierarchy rules and the hierarchical structures, wherein the data store further stores hierarchy rule information corresponding to the hierarchy rules.

23. The computer-implemented method of claim 22, wherein the step of identifying, by the pairing module, the plurality of first connectors on the first component and the plurality of second connectors on the second component comprises:
   identifying, by the pairing module, the plurality of first connectors on the first component;
   identifying, by the pairing module, a plurality of first auxiliary connectors on one or more below components of the first component according to the scope determined by the hierarchy module and the hierarchical structures;
   identifying, by the pairing module, the plurality of second connectors on the second component; and
   identifying, by the pairing module, a plurality of second auxiliary connectors on one or more above components and one or more below components of the second component according to the scope determined by the hierarchy module and the hierarchical structures.

24. The computer-implemented method of claim 23, wherein the pairing module is configured to form the selected matching pair by:
   selecting the one of the identified first connectors and one of the identified first auxiliary connectors, and selecting the one of the identified second connectors and one of the identified second auxiliary connectors, based on the priority determined by the hierarchy module and the pairing rules.

25. The computer-implemented method of claim 21, wherein the pairing module is configured to identify the first component and the second component according to user interface (UI) commands.

26. The computer-implemented method of claim 21, further comprising:
   when the plurality of first connectors is identified on the first component as possible connector candidates to form the selected matching pair, controlling, by the pairing module, the CAD software to highlight one or more of the identified first connectors on the first component.

27. The computer-implemented method of claim 26, further comprising:
   listing, by the pairing module, all of the formable matching pairs between the first connectors on the first component and the second connectors on the second component to allow a user to preview the matching result of each of the formable matching pairs and to select one of the formable matching pairs as the selected matching pair.

28. The computer-implemented method of claim 21, wherein the received intelligent rules for the intelligent behaviors of the components of the selected matching pair comprises: geometric data, procurement data, engineering and manufacturing rules, business rules, design for manufacturing and assembly rules, manufacturing process information, materials rules, and other customized rules and information.

29. The computer-implemented method of claim 28, further comprising:
   performing, by a geometric adjustment module executable by the at least one computing device, an operation to the components of the selected matching pair, wherein the operation comprises:
      positioning, by the geometric adjustment module, the first component in association to a location of the one of the identified second connectors; and
      modifying, by the geometric adjustment module, the geometric data of the first and second components related to the selected matching pair based on the intelligent rules.

30. The computer-implemented method of claim 28, further comprising:
   performing, by a constraint adding module executable by the at least one computing device, an operation to the components of the selected matching pair, wherein the operation comprises:
      establishing, by the constraint adding module, one or more constraint relationships between the first and second components related to the selected matching pair based on the constraint rules.

31. The computer-implemented method of claim 28, further comprising a computer-aided engineering (CAE) software to perform a CAE process, wherein the CAE process comprises finite element analysis, stress analysis, thermal analysis, electromagnetics analysis, fluid dynamic analysis, kinematics analysis, collision analysis, and dynamic analysis.

32. The computer-implemented method of claim 31, wherein the intelligent behavior module further comprises:
   other behavior modules executable by the at least one computing device, configured to perform an operation to the components of the selected matching pair, wherein the operation comprises:
   invoking the CAE software to perform the CAE process;
   communicating with outside resources;
   adjusting designing of the components;
   invoking cloud computing; and
   invoking expert analysis.

33. A non-transitory physical computer readable medium storing computer executable code, wherein the computer executable code, when executed by a processor, causes the processor to:
   add a plurality of connectors on a plurality of components, implement a geometric model for each of the plurality of components by executing a computer-aided design (CAD) software, and store component information of the components, connector information of the connectors on the components, pairing rule information corresponding to a plurality of pairing rules, and intelligent rule information corresponding to a plurality of intelligent rules on a data store, wherein each of the connectors is an object assigned with a particular predetermined group of a plurality of predetermined groups and defined to be associated with a corresponding virtual location on the geometric model of each of the components, the pairing rules are rules governing pairing of the connectors, the intelligent rules are rules for applying additional actions as intelligent behaviors to the components of a matching pair, and the pairing rules and the intelligent rules are respectively associated with the connectors;
   identify a first component;
   identify at least one second component capable of matching the first component;
   identify a plurality first connectors on the first component and a plurality second connectors on the second component, wherein the plurality of first connectors and the plurality of second connectors are assigned with the same predetermined group and form a plurality of formable matching pairs, and the formable matching pairs are formed only by the first connectors and the second connectors assigned with the same predetermined group;

match the first component to the second component by selecting, from the plurality of formable matching pairs, a selected matching pair using one of the identified first connectors and one of the identified second connectors based on the pairing rules;

receive the intelligent rules associated with the one of the identified first connectors and the one of the identified second connectors of the selected matching pair to apply the intelligent behaviors to the components of the selected matching pair; and invoke the intelligent behaviors applied to the components of the selected matching pair according to the intelligent rules associated with the one of the identified first connectors and the one of the identified second connectors of the selected matching pair.

34. The non-transitory physical computer readable medium of claim 33, wherein the computer executable code comprises:

a connector building module, when executed by the processor, causes the processor to add the connectors on the components explicitly by a CAD designer, or implicitly recognized by the connector building module automatically based on a geometry of the geometric model of each of the components or other rules;

a pairing module, when executed by the processor, causes the processor to:
  identify the first component;
  identify the at least one second component capable of matching the first component;
  identify the plurality of first connectors on the first component and the plurality of second connectors on the second component; and
  match the first component to the second component by forming the selected matching pair based on the pairing rules; and an intelligent behavior module, when executed by the processor, causes the processor to:
  receive the intelligent rules for the intelligent behaviors of the components of the selected matching pair; and
  invoke the intelligent behaviors applied to or associated with the components of the selected matching pair according to the intelligent rules.

35. The non-transitory physical computer readable medium of claim 34, wherein the computer executable code further comprises a hierarchy module, when executed by the processor, causes the processor to:

determine a plurality of levels of the components having the plurality of connectors thereon based on hierarchical structures of the components;

determine one of the identified second components to be the second component matching with the first component based on a plurality of hierarchy rules and the levels of the components; and determine scope and priority of the plurality of connectors at the corresponding hierarchical levels of the hierarchical structures, wherein the data store further stores hierarchy rule information corresponding to the hierarchy rules.

36. The non-transitory physical computer readable medium of claim 35, wherein the pairing module, when executed by the processor, causes the processor to identify the plurality of first connectors on the first component and the plurality of second connectors on the second component by:

identifying the plurality of first connectors on the first component;

identifying a plurality of first auxiliary connectors on one or more below components of the first component according to the scope determined by the hierarchy module and the hierarchical structures;

identifying the plurality of second connectors on the second component; and identifying a plurality of second auxiliary connectors on one or more above components and one or more below components of the second component according to the scope determined by the hierarchy module and the hierarchical structures.

37. The non-transitory physical computer readable medium of claim 36, wherein the pairing module, when executed by the processor, causes the processor to form the selected matching pair by selecting the one of the identified first connectors and one of the identified first auxiliary connectors, and selecting the one of the identified second connectors and one of the identified second auxiliary connectors, based on the priority determined by the hierarchy module and the pairing rules.

38. The non-transitory physical computer readable medium of claim 34, wherein the pairing module, when executed by the processor, further causes the processor to:

when the plurality of first connectors is identified on the first component as possible connector candidates to form the selected matching pair, control the CAD software to highlight one or more of the identified first connectors on the first component.

39. The non-transitory physical computer readable medium of claim 38, wherein the pairing module, when executed by the processor, further causes the processor to:

list all of the formable matching pairs between the first connectors on the first component and the second connectors on the second component to allow a user to preview the matching result of each of the formable matching pairs and to select one of the formable matching pairs as the selected matching pair.

40. The non-transitory physical computer readable medium of claim 34, wherein the received intelligent rules for the intelligent behaviors of the components of the selected matching pair comprises: geometric data, procurement data, engineering and manufacturing rules, business rules, design for manufacturing and assembly rules, manufacturing process information, materials rules, and other customized rules and information.

41. The non-transitory physical computer readable medium of claim 40, wherein the computer executable code comprises a computer-aided engineering (CAE) software, when executed by the processor, causes the processor to perform a CAE process, wherein the CAE process comprises finite element analysis, stress analysis, thermal analysis, electromagnetics analysis, fluid dynamic analysis, kinematics analysis, collision analysis, and dynamic analysis.

42. The non-transitory physical computer readable medium of claim 41, wherein the intelligent behavior module further comprises:

other behavior modules, when executed by the processor, causes the processor to perform an operation to the components of the selected matching pair, wherein the operation comprises:
  invoking the CAE software to perform the CAE process;
  communicating with outside resources;
  adjusting designing of the components;
  invoking cloud computing; and
  invoking expert analysis.

* * * * *